United States Patent
Yeo et al.

(10) Patent No.: US 10,680,465 B2
(45) Date of Patent: Jun. 9, 2020

(54) WIRELESS POWER TRANSMITTER

(71) Applicants: Samsung Electronics Co., Ltd., Suwon-si, Gyeonggi-do (KR); KWANGWOON UNIVERSITY INDUSTRY-ACADEMIC COLLABORATION FOUNDATION, Seoul (KR)

(72) Inventors: Sung-Ku Yeo, Suwon-si (KR); Hyun-Jun Ahn, Namyangju-si (KR); Yun-Seong Eo, Seongnam-si (KR); Sung-Bum Park, Suwon-si (KR)

(73) Assignees: Samsung Electronics Co., Ltd., Suwon-si (KR); KWANGWOON UNIVERSITY INDUSTRY-ACADEMIC COLLABORATION FOUNDATION, Seoul (KR)

( * ) Notice: Subject to any disclaimer, the term of this patent is extended or adjusted under 35 U.S.C. 154(b) by 140 days.

(21) Appl. No.: 15/762,867

(22) PCT Filed: Sep. 12, 2016

(86) PCT No.: PCT/KR2016/010298
§ 371 (c)(1),
(2) Date: Mar. 23, 2018

(87) PCT Pub. No.: WO2017/052132
PCT Pub. Date: Mar. 30, 2017

(65) Prior Publication Data
US 2018/0269725 A1  Sep. 20, 2018

(30) Foreign Application Priority Data

Sep. 25, 2015 (KR) .................. 10-2015-0136716
Sep. 25, 2015 (KR) .................. 10-2015-0136728
Sep. 25, 2015 (KR) .................. 10-2015-0136803

(51) Int. Cl.
*H02J 50/12* (2016.01)
*H02J 50/80* (2016.01)
(Continued)

(52) U.S. Cl.
CPC ............... *H02J 50/12* (2016.02); *H02J 7/02* (2013.01); *H02J 7/025* (2013.01); *H02J 50/40* (2016.02);
(Continued)

(58) Field of Classification Search
CPC . H02J 50/12; H02J 7/025; H02J 50/80; H03F 3/2173; H03F 3/2176
See application file for complete search history.

(56) References Cited

U.S. PATENT DOCUMENTS

2012/0153742 A1  6/2012  Lee et al.
2013/0043951 A1  2/2013  Irish et al.
(Continued)

FOREIGN PATENT DOCUMENTS

JP   2012-060850 A       3/2012
KR   10-2013-0111832 A  10/2013
(Continued)

*Primary Examiner* — Daniel Kessie
(74) *Attorney, Agent, or Firm* — Jefferson IP Law, LLP

(57) ABSTRACT

A wireless power transmitter may comprise: a signal generation unit which generates a differential signal; an amplifier which amplifies the differential signal with a predetermined gain; a resonance unit which generates an electromagnetic wave using the amplified differential signal and radiates the same; and a signal adjustment unit which senses at least one of the current and the voltage of the amplified differential signal at the input terminal of the resonance unit, and adjusts at least one of the phase and the (Continued)

amplitude of the differential signal output from the signal generation unit, on the basis of the result of the sensing.

14 Claims, 23 Drawing Sheets

(51) Int. Cl.
    *H02J 7/02*     (2016.01)
    *H02J 50/40*     (2016.01)
    *H03F 3/217*     (2006.01)

(52) U.S. Cl.
    CPC ............ *H02J 50/80* (2016.02); *H03F 3/2173* (2013.01); *H03F 3/2176* (2013.01); *H03F 2200/108* (2013.01); *H03F 2200/387* (2013.01)

(56) References Cited

U.S. PATENT DOCUMENTS

| | | | | |
|---|---|---|---|---|
| 2014/0300202 | A1* | 10/2014 | Shimokawa | H02J 50/12 |
| | | | | 307/104 |
| 2015/0303703 | A1* | 10/2015 | Hayashi | H02J 5/005 |
| | | | | 307/104 |
| 2015/0333537 | A1 | 11/2015 | Uchida | |
| 2016/0013660 | A1* | 1/2016 | Riehl | H02J 50/12 |
| | | | | 307/104 |
| 2017/0019077 | A1* | 1/2017 | Wang | H03F 3/265 |

FOREIGN PATENT DOCUMENTS

| | | |
|---|---|---|
| KR | 10-2014-0053302 A | 5/2014 |
| KR | 10-2014-0097372 A | 8/2014 |
| KR | 10-2014-0120404 A | 10/2014 |
| KR | 10-2015-0106950 A | 9/2015 |

\* cited by examiner

WIRELESS POWER TRANSMITTER

CROSS-REFERENCE TO RELATED APPLICATION(S)

This application is a National Phase Entry of PCT International Application No. PCT/KR2016/010298, which was filed on Sep. 12, 2016, and claims priorities to Korean Patent Application No. 10-2015-0136803, which was filed on Sep. 25, 2015 and Korean Patent Application No. 10-2015-0136716, which was filed on Sep. 25, 2015, and Korean Patent Application No. 10-2015-0136728, which was filed on Sep. 25, 2015, the contents of which are incorporated herein by reference.

TECHNICAL FIELD

The present disclosure relates to a wireless power transmitter and relates to a wireless power transmitter that wirelessly transmits power to at least one wireless power receiver.

BACKGROUND ART

Mobile terminals such as a mobile phone, a Personal Digital Assistant (PDA) and the like are driven by rechargeable batteries due to their nature, and the battery of the mobile terminal is charged via supplied electronical energy by using a separate charging device. Typically, the charging device and the battery have separate contact terminals at an exterior thereof, respectively, and are electrically connected with each other by contacting the contact terminals.

However, in such a contact-type charging scheme, the contact terminals protrude outwardly, and thus are easily contaminated by foreign substances. As a result, battery charging is not correctly performed. Also, charging may not be correctly performed when the contact terminals are exposed to moisture.

Recently, a wireless charging or a non-contact charging technology has been developed and used for many electronic devices to solve the above-mentioned problems.

The wireless charging technology uses wireless power transmission and reception, and corresponds to, for example, a system in which a battery is automatically charged if the battery is simply put on a charging pad without connecting the mobile phone to a separate charging connector. Generally, a wireless vibrating toothbrush, a wireless electric shaver, and the like are known to the general public. The wireless charging technology can improve a waterproof function because it can be used to wirelessly charge the electronic devices. The wireless charging technology can improve the portability of the electronic devices because it does not require a wired charger. Therefore, it is expected that technologies related to the wireless charging technology will be significantly developed in the coming age of electric cars.

The wireless charging technology largely includes an electromagnetic induction scheme using a coil, a resonance scheme using a resonance, and an RF/microwave radiation scheme converting electrical energy to a microwave and then transmitting the microwave.

It is considered up to now that the electromagnetic induction scheme is mainstream, but it is expected that the day will come when all electronic products are wirelessly charged, anytime and anywhere, without a wire in the near future on the strength of recent successful experiments for wirelessly transmitting power to a destination spaced away by dozens of meters through the use of microwaves at home and abroad.

A power transmission method through the electromagnetic induction corresponds to a scheme of transmitting electric power between a first coil and a second coil. When a magnet is moved in a coil, an induction current is generated. By using the induction current, a magnetic field is generated at a transmitting end, and an electric current is induced according to a change in the magnetic field so as to generate energy at a receiving end. The phenomenon is referred to as magnetic induction, and the power transmission method using magnetic induction has a high energy transmission efficiency.

A resonance scheme is a wireless charging scheme using resonance. It is known that the resonant electrical energy does not affect surrounding machines or human bodies differently from other electromagnetic waves because the resonant electrical energy is directly transferred only to a device having a resonance frequency and unused parts are reabsorbed into an electromagnetic field instead of spreading into the air.

DETAILED DESCRIPTION OF THE DISCLOSURE

Technical Problem

A conventional wireless power transmitter and wireless power receiver may generate a differential signal, and then may input and output the generated differential signal to or from each element. When a differential signal is used, the phase difference between two signals included in the differential signal should be maintained at 180 degrees, and a balance of the signals is required to be maintained to be constant. However, in a conventional wireless charging system, in order to maintain the balance of a differential signal for each node, an adaptive switch having a large loss is used. Moreover, when the location of a wireless power receiver is changed, a resonance impedance may change. The change of resonance impedance may cause the distortion of the waveform of the differential signal and thus the balance may be destroyed. According to the destruction of the balance, EMI may be increased and the power efficiency may degrade.

Various embodiments may provide a wireless power transmitter, a wireless power receiver, and a differential signal calibration circuit, which calibrate a differential signal to maintain a phase difference between two signals. In addition, the present disclosure may provide a wireless power transmitter which can adjust at least one among the phase and the amplitude of a single-ended signal.

Technical Solution

In various embodiments of the present disclosure, a wireless power transmitter may include: a signal generation unit configured to generate a differential signal; an amplifier configured to amplify the differential signal by a pre-configured gain; a resonance unit configured to generate an electromagnetic wave using the amplified differential signal and then radiate the generated electromagnetic wave; and a signal adjustment unit configured to sense at least one among a current and a voltage of the amplified differential signal in an input terminal of the resonance unit, and adjust at least one among a phase and an amplitude of the differential signal output from the signal generation unit on the basis of a result obtained by the sensing.

In various embodiments of the present disclosure, a wireless power transmitter may include: a signal generation unit configured to generate a single-ended signal; an amplifier configured to amplify the single-ended signal by a pre-configured gain; a resonance unit configured to generate an electromagnetic wave using the amplified single-ended signal and then radiates the generated electromagnetic wave; and a signal adjustment unit configured to sense at least one among a current and a voltage of the amplified single-ended signal in an input terminal of the resonance unit, and adjusts at least one among a phase and an amplitude of the single-ended signal output from the signal generation unit on the basis of a result obtained by the sensing.

According to various embodiments of the present disclosure, the symmetry of the differential signal output from the wireless power transmitter is ensured, so that the efficiency of wireless charging can be increased, and EMI can be decreased.

In addition, according to various embodiments of the present disclosure, at least one among a phase and an amplitude of the single-ended signal output from the wireless power transmitter may be controlled, so that the efficiency of wireless charging can be increased.

BRIEF DESCRIPTION OF DRAWINGS

The above and other aspects, features and advantages of the present disclosure will be more apparent from the following detailed description taken in conjunction with the accompanying drawings, in which.

MODE FOR CARRYING OUT THE DISCLOSURE

Figure 1:
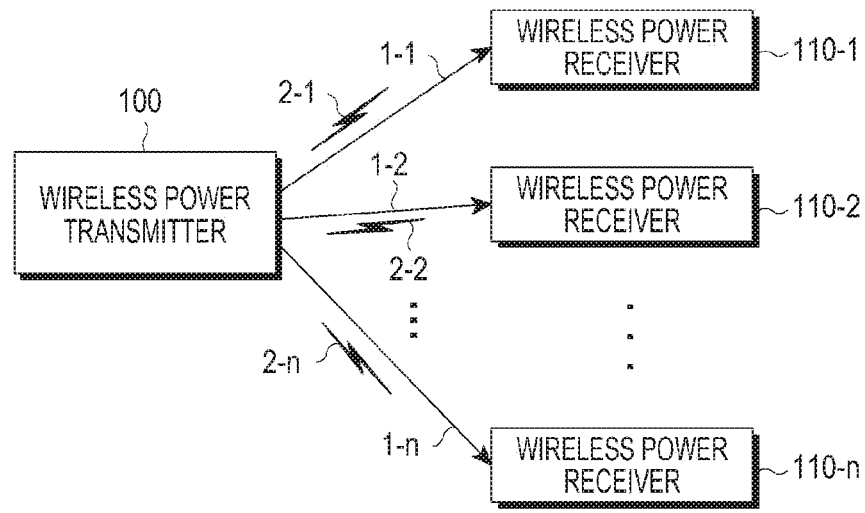
FIG. 1 illustrates a concept describing general operations of a wireless charging system.

Hereinafter, various embodiments of the present disclosure will be described with reference to the accompanying drawings. However, it should be understood that there is no intent to limit the present disclosure to the particular forms disclosed herein; rather, the present disclosure should be construed to cover various modifications, equivalents, and/or alternatives of embodiments of the present disclosure. In describing the drawings, similar reference numerals may be used to designate similar elements.

As used herein, the expression "have", "may have", "include", or "may include" refers to the existence of a corresponding feature (e.g., numeral, function, operation, or element such as component), and does not exclude one or more additional features.

In the present disclosure, the expression "A or B", "at least one of A or/and B", or "one or more of A or/and B" may include all possible combinations of the items listed. For example, the expression "A or B", "at least one of A and B", or "at least one of A or B" refers to all of (1) including at least one A, (2) including at least one B, or (3) including all of at least one A and at least one B.

The expression "a first", "a second", "the first", or "the second" used in the present disclosure may modify various elements regardless of the order and/or the importance thereof, and may be used to distinguish an element from another element, but does not limit the corresponding components. For example, a first user device and a second user device indicate different user devices regardless of the order and/or the importance thereof. For example, a first element may be termed a second element, and similarly, a second element may be termed a first element without departing from the scope of the present disclosure.

It should be understood that when an element (e.g., first element) is referred to as being (operatively or communicatively) "connected," or "coupled," to another element (e.g., second element), the element may be directly connected or coupled directly to the other element or any other element (e.g., third element) may be interposed between them. In contrast, it may be understood that when an element (e.g., first element) is referred to as being "directly connected," or "directly coupled" to another element (second element), there are no element (e.g., third element) interposed between them.

The expression "configured to" used in the present disclosure may be exchanged with, for example, "suitable for", "having the capacity to", "designed to", "adapted to", "made to", or "capable of" according to the situation. -{ }--{ }-The term "configured to" may not necessarily imply "specifically designed to" in hardware. Alternatively, in some situations, the expression "device configured to" may mean that the device, together with other devices or components, "is able to". For example, the phrase "processor adapted (or configured) to perform A, B, and C" may mean a dedicated processor (e.g. embedded processor) only for performing the corresponding operations or a generic-purpose processor (e.g., central processing unit (CPU) or application processor (AP)) that can perform the corresponding operations by executing one or more software programs stored in a memory device.

The terms used herein are merely for the purpose of describing particular embodiments and are not intended to limit the scope of other embodiments. A singular expression may include a plural expression unless they are definitely different in a context. All terms used herein, including technical and scientific terms, have the same meaning as those commonly understood by a person skilled in the art to which the present disclosure pertains. Such terms as those defined in a generally used dictionary may be interpreted to have the meanings equal to or similar to the contextual meanings in the relevant field of art, and are not to be interpreted to have ideal or excessively formal meanings unless clearly defined in the present disclosure. In some cases, even the term defined in the present disclosure should not be interpreted to exclude embodiments of the present disclosure.

FIG. 1 illustrates a concept describing general operations of a wireless charging system. As shown in FIG. 1, the wireless charging system includes a wireless power transmitter 100 and one or more wireless power receivers 110-1, 110-2, . . . , and 110-n.

The wireless power transmitter 100 may wirelessly transmit power 1-1, 1-2, . . . , and 1-n to the one or more wireless power receivers 110-1, 110-2, . . . , and 110-n, respectively.

The wireless power transmitter 100 may form an electrical connection with the wireless power receivers 110-1, 110-2, . . . , and 110-n. For example, the wireless power transmitter 100 may radiate an electromagnetic field or a magnetic field to transmit power 1-1, 1-2, . . . , and 1-n. The wireless power transmitter 100 may transmit wireless power on the basis of an induction scheme, a resonance scheme, or an electromagnetic wave scheme.

Meanwhile, the wireless power transmitter 100 may perform bidirectional communication with the wireless power receivers 110-1, 110-2, . . . , and 110-n. In a case of communication using an out-band scheme, the wireless power transmitter 100 and the wireless power receivers 110-1, 110-2, . . . , and 110-n may process or transmit and receive a communication signal 2-1, 2-2, . . . , and 2-n including a predetermined frame. The wireless power receiver may be implemented by a mobile communication terminal, a PDA, a PMP, a smart phone, a wearable electronic device, etc. In a case of communication using an in-band scheme, the wireless power receivers 110-1, 110-2, . . . , and 110-n may perform load modulation, and the wireless power transmitter 100 may obtain a report of the wireless power receivers 110-1, 110-2, . . . , and 110-n according to the detection of a load change.

The wireless power transmitter 100 may wirelessly provide power to a plurality of wireless power receivers 110-1, 110-2, . . . , and 110-n. For example, the wireless power transmitter 100 may transmit power to the plurality of wireless power receivers 110-1, 110-2, . . . , and 110-n through the resonance scheme. When the wireless power transmitter 100 adopts the resonance scheme, distances between the wireless power transmitter 100 and the plurality of the wireless power receivers 110-1, 110-2, . . . , and 110-n may be distances for the operation in an indoor environment. Further, when the wireless power transmitter 100 adopts an electromagnetic induction scheme, it is preferable that the distances between the wireless power transmitter 100 and the plurality of wireless power receivers 110-1, 110-2, . . . , and 110-n are 10 cm or shorter.

The wireless power receivers 110-1, 110-2, . . . , and 110-n may receive wireless power from the wireless power transmitter 100 to charge batteries therein. Further, the wireless power receivers 110-1, 110-2, . . . , and 110-n may transmit a signal of requesting a wireless power transmission, information necessary for a wireless power reception, information on states of the wireless power receivers, or information on a control of the wireless power transmitter 100 to the wireless power transmitter 100.

In addition, the wireless power receivers 110-1, 110-2, . . . , and 110-n may transmit a message indicating a charging state of each of the wireless power receivers 110-1, 110-2, . . . , and 110-n to the wireless power transmitter 100 in the in-band scheme or out-band scheme.

The wireless power transmitter 100 may include a displaying means, such as a display and may display a state of each of the wireless power receivers 110-1, 110-2, . . . , and 110-n on the basis of the message received from the each of the wireless power receivers 110-1, 110-2, . . . , and 110-n. The wireless power transmitter 100 may also display an expected time period until each of the wireless power receivers 110-1, 110-2, . . . , and 110-n is completely charged.

Figure 2:
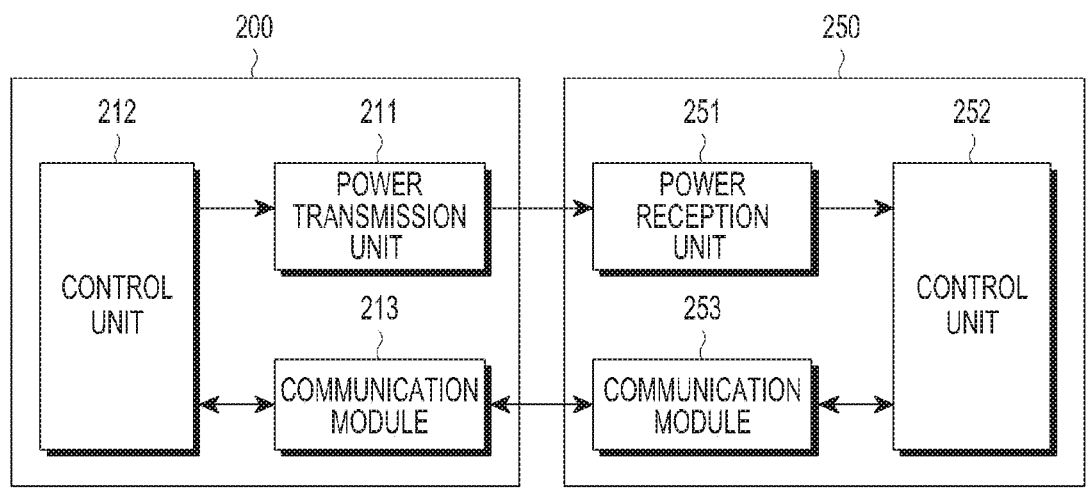
FIG. 2 is a block diagram illustrating a wireless power transmitting unit and a wireless power receiving unit according to an embodiment of the present disclosure.

FIG. 2 is a block diagram illustrating a wireless power transmitter and a wireless power receiver according to an embodiment of the present disclosure.

Referring to FIG. 2, the wireless power transmitter 200 may include a power transmission unit 211, a control unit 212, and a communication unit 213. Also, the wireless power transmitter 250 may include a power reception unit 251, a control unit 252, and a communication module 253.

The power transmission unit 211 may provide power required by the wireless power receiver 250 and may wirelessly provide power to the wireless power receiver 250.

In addition, the power transmission unit 211 may supply alternating current waveforms to the wireless power receiver 250. The power transmission unit 211 may include a resonance circuit, an inductive circuit, or a patch antenna array, and, accordingly, may transmit or receive a predetermined electromagnetic wave. When the power transmission unit 211 is implemented by a resonance circuit, the inductance (L) of a loop coil of the resonance circuit may be changeable. Meanwhile, it will be easily understood by those skilled in the art that the power transmission unit 211 has no limitation as long as the power transmission unit 211 is a means which can transmit the electromagnetic field or magnetic field.

The control unit 212 may control overall operations of the wireless power transmitter 200. The control unit 212 or the control unit 252 may control the general operation of the wireless power transmitter 200 or the wireless power receiver 250 by using an algorithm, a program, or an application, required for the control, read from a memory (not shown). The control unit 212 or the control unit 252 may include one or more among a central processing unit, an application processor, and a Communication Processor (CP). Otherwise, the control unit 212 or the control unit 252 may be implemented by a Micro Controlling Unit (MCU) or a mini computer. The control unit 212 or the control unit 252 may execute calculation or data processing relating to control and/or communication of one or more other elements.

The communication module 213 may perform communication with the wireless power receiver 250 or another electronic device using a predetermined scheme. The communication module 213 may communicate with the communication module 253 of the wireless power receiver 250 by using a Near Field Communication (NFC) scheme, a Zigbee communication scheme, an infrared communication scheme, a visible ray communication scheme, a Bluetooth communication scheme, a Bluetooth Low Energy (BLE) scheme, Magnetic Secure Transfer (MST) scheme, or the like. Meanwhile, the above-described communication schemes are merely illustrative, and the scope of the embodiments of the present disclosure is not limited to a specific communication scheme that is performed by the communication module 213.

The power reception unit 251 may receive, based on the induction scheme or the resonance scheme, wireless power from the power transmission unit 211.

Figure 3A:
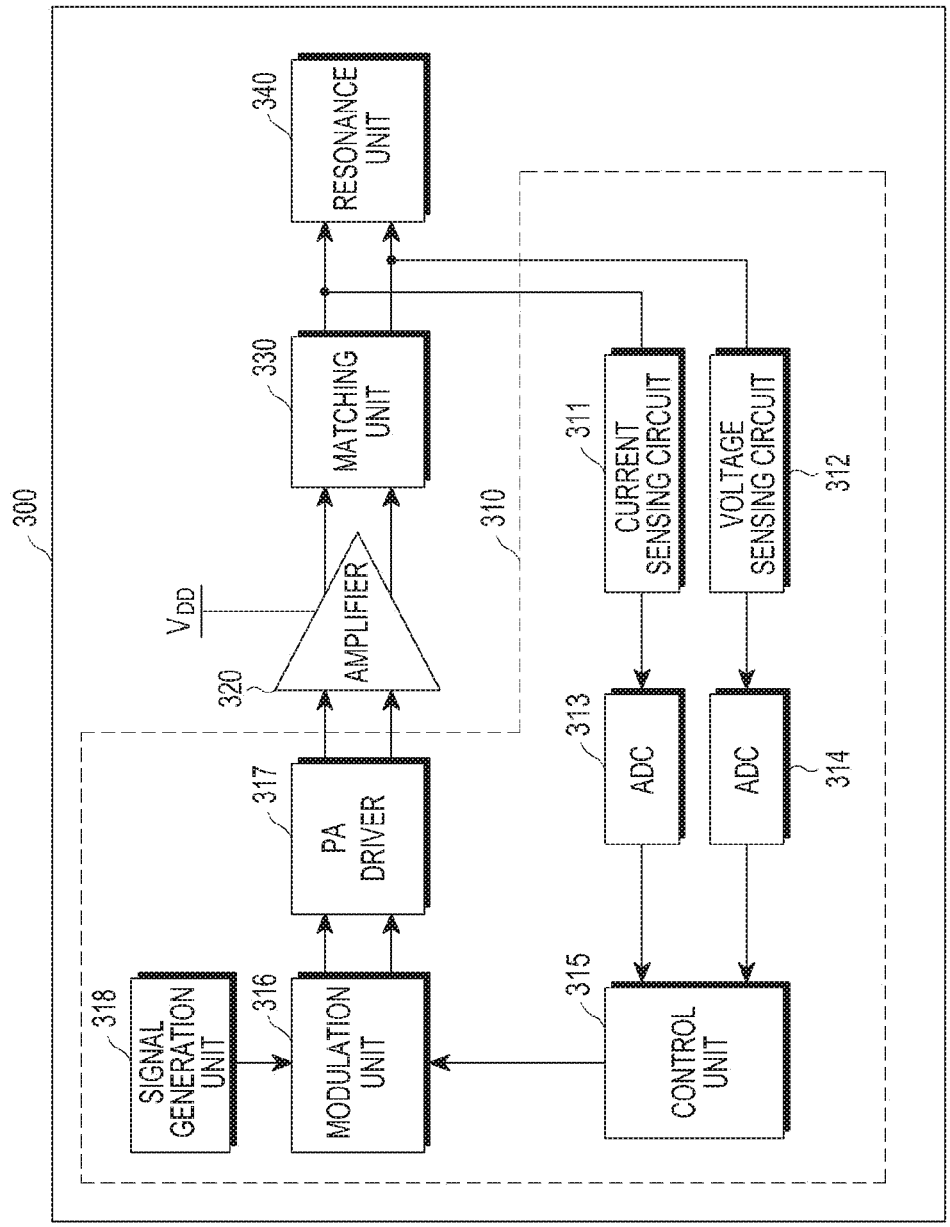
FIGS. 3A to 3C illustrate a block diagram of a wireless power transmitter according to various embodiments of the present disclosure.
Figure 3B:
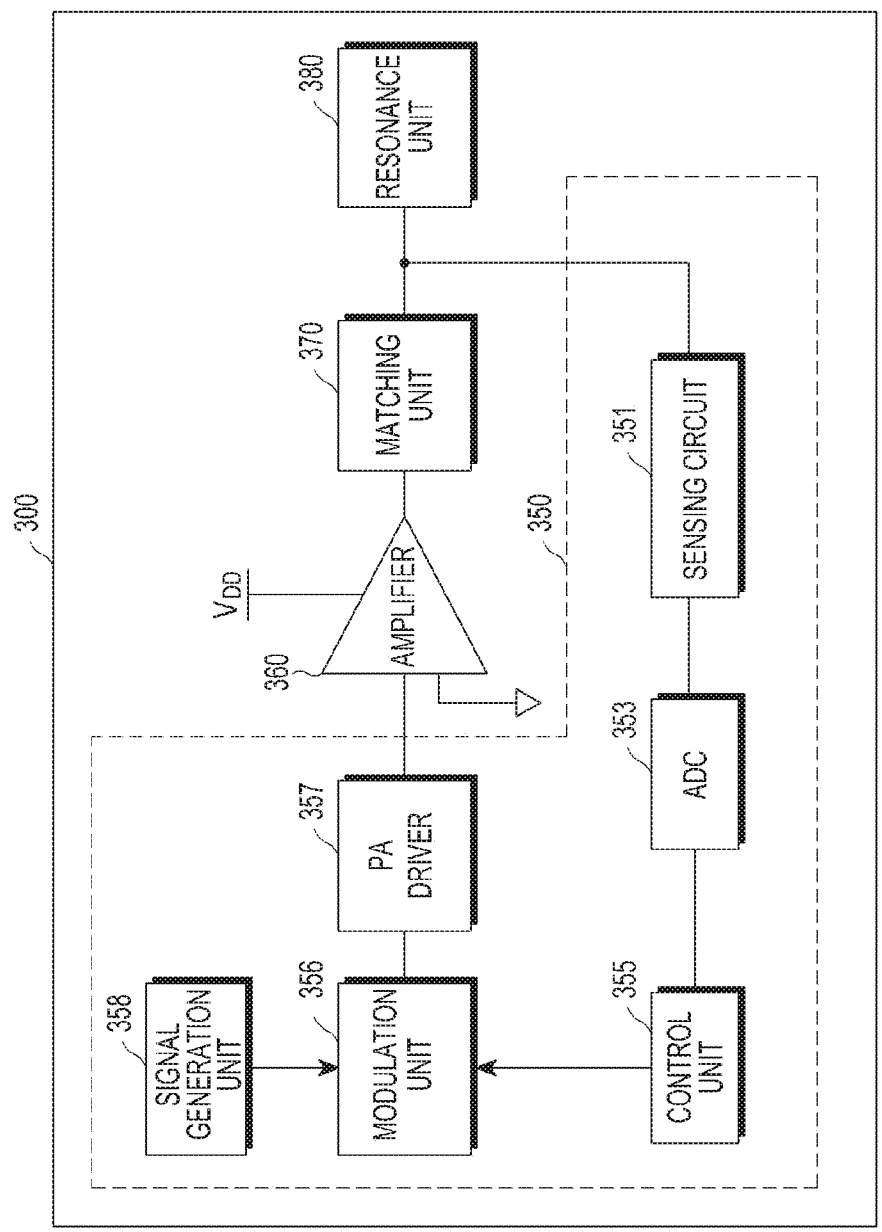
Figure 3C:
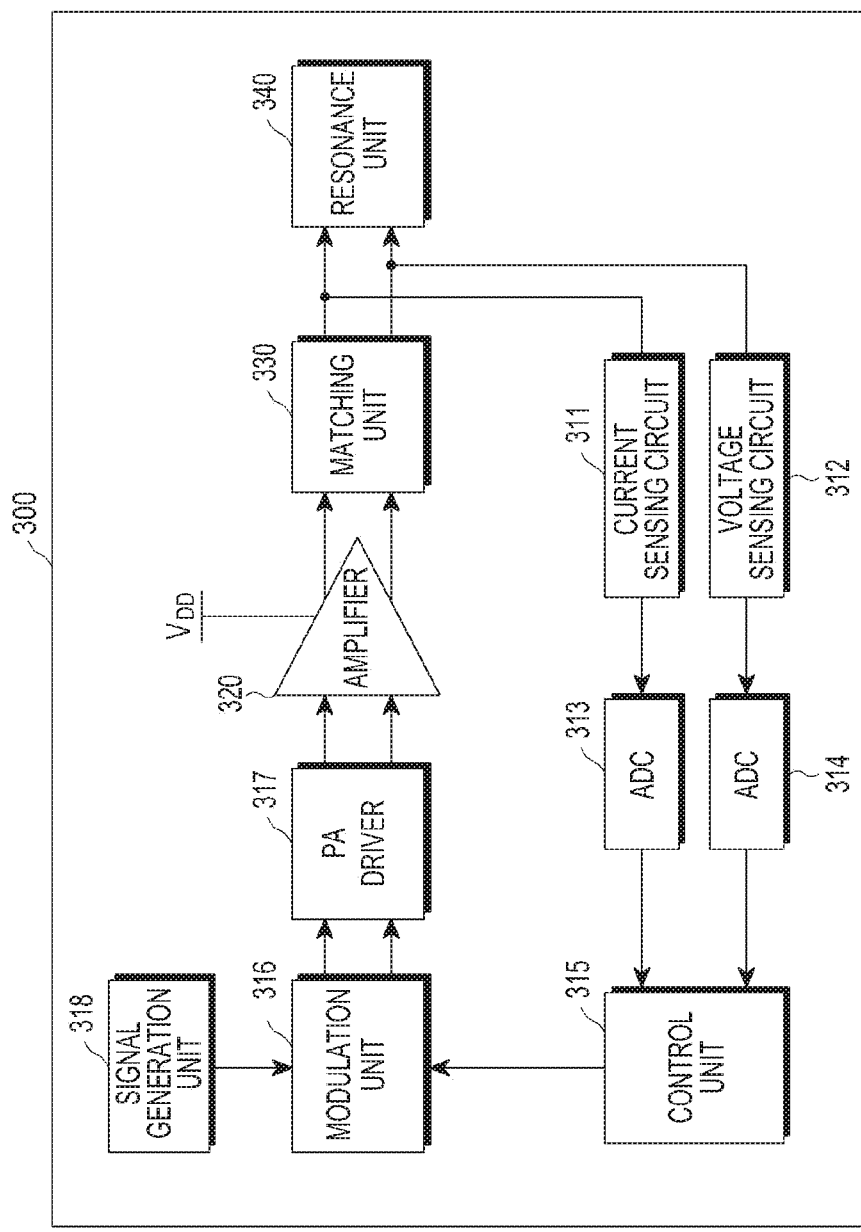

FIGS. 3A to 3C illustrate a block diagram of a wireless power transmitter according to various embodiments of the present disclosure.

Referring to FIG. 3A, a wireless power transmitter 300 may include a signal adjustment unit 310, an amplifier 320, a matching unit 330, and a resonance unit 340.

The signal adjustment unit may include a current sensing circuit 311, a voltage sensing circuit 312, ADCs 313 and 314, a control unit 315, a modulation unit 316, a Power Amplifier (PA) driver 317, and a signal generation unit 318. The signal adjustment unit 310 may be implemented by an Integrated circuit (IC), but has no limit on a type that can be implemented.

In an embodiment of FIG. 3A, the signal adjustment unit 310 may generate a differential signal using the signal generation unit 318, and may output the generated differential signal to the amplifier 320. For example, the signal generation unit 318 may include a power providing means that can generate a single-ended signal. The power providing means may be implemented by a battery included in the wireless power transmitter 300 or a power interface that receives power from the outside. When the power providing means is implemented by a battery, the signal generation unit 318 may further include an inverter that converts DC power output from the battery into AC power. When the power providing means is implemented by a power interface, the power providing means may receive AC power from the outside, or may receive DC power and then convert the received DC power into AC power, and may further include an inverter.

Meanwhile, the signal generation unit 318 may generate a differential signal from the single-ended signal. The signal generation unit 318 may include, for example, a branch rail that is connected in parallel to a rail that receives a single-ended signal, and may include an inverted signal generation unit such as an inverter located on the branch rail. Accordingly, a first signal having a phase identical to the single-ended signal may be output from one rail of the signal generation unit 318 and a second signal having a phase difference of 180 degrees from the single-ended signal may be output through the inverted signal generation unit from the branch rail. Accordingly, the signal generation unit 318 may generate a differential signal including a first signal and a second signal which have a phase difference of 180 degrees from each other.

The modulation unit 316 may adjust at least one signal in the differential signal. The modulation unit 316 may adjust at least one among an amplitude and a phase of at least one signal in the differential signal. In one embodiment, the modulation unit 316 may delay at least one signal in the differential signal to adjust a phase of the at least one signal in the differential signal. The modulation unit 316 may include a DC/DC converting means or a voltage divider and, accordingly, may adjust an amplitude of at least one signal in the differential signal. In another embodiment, instead of the modulation unit 316, a driving voltage (VDD) of the amplifier 320 may be adjusted such that an amplitude of at least one signal in the differential signal is adjusted. In this embodiment, a DC/DC converting means, a voltage divider, or the like may be arranged on a rail to which the driving voltage (VDD) of the amplifier 320 is applied.

The PA driver 317 may perform current pumping on a differential signal output from the modulation unit 316. Accordingly, an On/Off delay time of an input signal of the amplifier 320 is shortened, a noise of the input signal is removed, and the input signal from which the noise has been removed may be amplified by a pre-configured gain. In various embodiments of the present disclosure, the input signal may be a differential signal or a single-ended signal.

In one embodiment, the amplifier 320 may be implemented by a D-class or an E-class amplifier. In this embodiment, the voltage of a signal input to the amplifier 320 is required to be relatively high and the PA driver 317 may amplify a differential signal output from the modulation unit 316 to a level at which the differential signal can be used in a D-class or an E-class amplifier.

In various embodiments of the present disclosure, the PA driver 317 may include at least one inductor. The inductor may prevent an abrupt change of a current. Accordingly, when a differential signal input to the PA driver includes a peak, the PA driver 317 may output the differential signal excluding the peak. A more detailed description will be given and a relative location of the wireless power receiver with respect to the wireless power transmitter may be changed. Since the wireless power receiver also may include an inductor, the wireless power transmitter and the wireless power receiver may be circuit-coupled. Accordingly, impedance may be changed due to a change of a relative location. According to a change of impedance, a peak may be included in a differential signal input to the PA driver 317. The occurrence of a peak may be prevented by an inductor included in the PA driver 317. In addition, when the wireless power transmitter operates on the basis of, for example, an A4WP standard scheme, a relatively high frequency of 6.78 MHz may be used as a resonance frequency. Also, even when a performance is changed depending on the impedance of the resonance unit, an antenna, or a load, the PA driver 317 including an inductor has a characteristic robust against the change and thus can more stably amplify a signal. In various embodiments of the present disclosure, the PA driver 317 may additionally include a capacitor or an FET device as well as the inductor. The various embodiments will be described more detail with reference to FIGS. 10A to 10G.

The amplifier 320 may amplify a differential signal output from the PA driver 317 by a pre-configured gain. The amplifier 320 may be implemented by, for example, a class-D or class-E amplifier. The amplifier 320 may perform amplification using a driving voltage (VDD). Meanwhile, as described above, in one embodiment, a driving voltage (VDD) may be changed. For example, the wireless power transmitter 300 may include a device that can change a voltage, such as a DC/DC converter or a voltage divider arranged on a rail which provides a driving voltage VDD to the amplifier 320. When it is determined that there is a need to adjust the amplitude of a differential signal output from the amplifier 320, the wireless power transmitter 300 may operate a DC/DC converter or a voltage divider to change a gain of the amplifier 320, so that the amplitude of an output differential signal can be adjusted.

The matching unit 330 may include various devices for matching impedance, for example, at least one among at least one inductor and at least one capacitor. As described above, a relative location of the wireless power receiver with respect to the wireless power transmitter is variable. Accordingly, when the wireless power receiver is arranged on the wireless power transmitter, the wireless power receiver may have various impedances. The wireless power transmitter 300 may increase the efficiency of wireless charging through impedance matching.

The resonance unit 340 may generate an electromagnetic field using a differential signal from the amplifier 320, to radiate the generated electromagnetic field to the outside. When the wireless power transmitter 300 operates on the basis of an A4WP scheme, the resonance unit 340 may be designed to have a resonance frequency of 6.78 MHz and may generate an electromagnetic field having a resonance frequency to radiate the generated electromagnetic field to the outside. The resonance unit 340 may include at least one inductor and at least one capacitor, which are included in a resonance circuit.

The current sensing circuit 311 may sense an electrical characteristic, for example, a current value, of a first signal in a first input terminal of the resonance unit 340. The voltage sensing circuit 312 may sense an electrical characteristic, for example, a voltage value, of a second signal in a second input terminal of the resonance unit 340. Meanwhile, in various embodiments of the present disclosure, the current sensing circuit 311 is connected to the second input terminal of the resonance unit 340, and the voltage sensing circuit 312 may be connected to the first input terminal of the resonance unit 340. In addition, in another embodiment of the present disclosure, two current sensing circuits may be connected to the first input terminal and the second input terminal of the resonance unit 340, respectively, and two voltage sensing circuits may be connected to the first input terminal and the second input terminal of the resonance unit 340, respectively.

The ADC 313 may convert an analog value of a current value sensed by the current sensing circuit 311 into a digital value, to output the converted value to the control unit 315. The ADC 314 may convert an analog value of a voltage value sensed by the voltage sensing circuit 312 into a digital value, to output the converted value to the control unit 315.

The control unit 315 may use a current value of a first signal and a voltage value of a second signal to determine modulation information of the signals. For example, the control unit 315 may identify a difference in phase between a first signal and a second signal using a current value of the first signal and a voltage value of the second signal. The control unit 315 may identify, for example, that a difference in phase between a first signal and a second signal is 183 degrees. The control unit 315 may determine modulation information of a signal, for maintaining a difference in phase between a first signal and a second signal at 180 degrees. For example, the control unit 315 may determine modulation information allowing a second signal to be delayed by interval t or a phase thereof to be changed. The control unit 315 may output a control signal corresponding to determined modulation information to the modulation unit 316. The modulation unit 316 may delay a second signal by interval t or may change a phase thereof on the basis of the input control signal. Accordingly, a difference in phase between a first signal and the second signal can be maintained at a pre-configured value, for example, at 180 degrees. In another embodiment, the control unit 315, for example, may identify, using a digital value from the ADC 314, that the amplitude of a second signal is A'. The control unit 315 may determine modulation information allowing the amplitude of a second signal to be adjusted to be A, to output a control signal corresponding to the modulation information. For example, when the modulation unit 316 adjusts an amplitude, the control unit 315 may output a control signal for adjusting the amplitude to the modulation unit 316. In another embodiment, when the amplifier 320 adjusts an amplitude, the control unit 315 may output a control signal to a device, such as a DC/DC converter, a voltage divider, etc. arranged on a rail to which a driving voltage of the amplifier 320 is applied. Accordingly, the wireless power transmitter may monitor a change of impedance, a mismatch of a differential signal, signal distortion, or the like in real time, to control the same. Therefore, a charging efficiency can be increased and EMI can be decreased.

According to the above description, the modulation unit 316 may adjust a differential signal such that a difference in phase between a first signal and a second signal is maintained at a pre-configured value, or the amplitude of at least one among the first signal and the second signal is maintained at a pre-configured value. Accordingly, a first signal and a second signal included in the differential signal have a pre-configured phase difference in spite of a change of impedance and thus have waveforms which are not distorted. Therefore, it is possible to achieve relatively low EMI and high charging efficiency.

When the amplifier 320 selects a switching scheme of a class D, E, or F, the amplifier 320 may use, as an input signal, a signal of a square wave which can turn on/off a power device. In a differential signal of a square wave, two signals should maintain a monotonous and continuous phase difference. The number of bits of digital control may vary depending on a maximum range of a phase difference to be changed and a minimum variance width of a phase difference. In a case where a maximum range is large and a minimum variance width is very small and minute, the number of phase steps becomes greater so that the number of control bits is large. On the contrary, in a case where a maximum range is small and a minimum variance width is relatively large, a small number of control bits are required. The phase control is required to enable a phase change to be continuous and include monotonous increase or decrease. Only the monotonous phase change can prevent a discontinuous point or a state of unstable control from occurring when a phase difference is controlled through adjustment of a code during digital control. Additionally, for phase control, a low power circuit design is required to have an ability to sufficiently operate an input terminal of the amplifier 320 and to achieve the power efficiency of the entire transmission unit. Therefore, the signal adjustment unit 310 may control a phase using only digital circuits for a characteristic of low power and can output a square wave in which a phase can be controlled in a shape of a continuous and monotonous increase. In addition, the signal adjustment unit 310 can control a power source of a logic circuit, such as an inverter that pulse-width modulates an amplitude of a PWM signal, which is an input signal that has a great effect on the efficiency of the amplifier 320, thereby maximizing the efficiency of the amplifier 320.

In various embodiments of the present disclosure, the amplifier 320, the matching unit 330, and the resonance unit 340 may be disposed at an outside of the signal adjustment unit 310. Also, the signal generation unit 318 may be disposed at an outside of the signal adjustment unit 310 or may be included in the signal adjustment unit 310, according to an embodiment. More specifically, when the signal generation unit 318 is implemented by a battery, the signal generation unit 318 may be disposed at an outside of the signal adjustment unit 310. When the signal generation unit 318 is implemented by a power interface, the signal generation unit 318 may be included in the signal adjustment unit 310. A device disposed at the outside of the signal adjustment unit 310 may be implemented by an analog device. Meanwhile, in various embodiments of the present disclosure, the wireless power transmitter may sense a current value and a voltage value on various locations as well as an input terminal of the resonance unit 340.

FIG. 3B illustrate a block diagram of a wireless power transmitter using a single-ended signal according to various embodiments of the present disclosure.

Referring to FIG. 3B, a wireless power transmitter 300 may include a signal adjustment unit 350, an amplifier 360, a matching unit 370, and a resonance unit 380.

The signal adjustment unit 350 may include a sensing circuit 351, an ADC 353, a control unit 355, a modulation unit 356, a Power Amplifier (PA) driver 357, and a signal generation unit 358. The signal adjustment unit 350 may be implemented by an Integrated circuit (IC), but has no limit on a type that can be implemented.

In an embodiment of FIG. 3B, the signal adjustment unit 350 may generate a single-ended signal, and may output the generated single-ended signal to the amplifier 360. The signal generation unit 358 may generate a single-ended signal. For example, the signal generation unit 358 may include a power providing means that can generate a single-ended signal. The power providing means may be implemented by a battery included in the wireless power transmitter 300 or a power interface that receives power from the outside. When the power providing means is implemented by a battery, the signal generation unit 358 may further include an inverter that converts DC power output from the battery into AC power. When the power providing means is implemented by a power interface, the power providing means may receive AC power from the outside, or may receive DC power and then convert the received DC power into AC power, and may further include an inverter.

The modulation unit 356 may adjust a single-ended signal. The modulation unit 356 may adjust at least one among an amplitude and a phase of a single-ended signal. In one embodiment, the modulation unit 356 may delay a single-ended signal to adjust a phase of the single-ended signal. The modulation unit 356 may include a DC/DC converting means or a voltage divider and, accordingly, may adjust an amplitude of the single-ended signal. Meanwhile, in another embodiment, instead of the modulation unit 356, a driving voltage (VDD) of the amplifier 360 may be adjusted so that an amplitude of the single-ended signal is adjusted. In this embodiment, a DC/DC converting means, a voltage divider, or the like may be arranged on a rail to which a driving voltage (VDD) of the amplifier 360 is applied.

The PA driver 357 may perform current pumping on a differential signal output from the modulation unit 356. Accordingly, an On/Off delay time of an input signal of the amplifier 360 is shortened, a noise of the input signal is removed, and the input signal from which the noise has been removed may be amplified by a pre-configured gain. In various embodiments of the present disclosure, the input signal may be a differential signal or a single-ended signal.

In one embodiment, the amplifier 360 may be implemented by a D-class or an E-class amplifier. In this embodiment, the voltage of a signal input to the amplifier 360 is required to be relatively high and the PA driver 357 may amplify a single-ended signal output from the modulation unit 356 to a level at which the single-ended signal can be used in a D-class or an E-class amplifier.

In various embodiments of the present disclosure, the PA driver 357 may include at least one inductor. The inductor may prevent an abrupt change of a current. Accordingly, when a differential signal input to the PA driver 357 includes a peak, the PA driver may output the differential signal excluding the peak.

The amplifier 360 may amplify a single-ended signal output from the PA driver 357 by a pre-configured gain. The amplifier 360 may be implemented by, for example, a class-D or class-E amplifier. The amplifier 360 may perform amplification using a driving voltage (VDD). Meanwhile, as described above, in one embodiment, a driving voltage (VDD) may be changed. For example, the wireless power transmitter 300 may include a device that can change a voltage, such as a DC/DC converter or a voltage divider arranged on a rail which provides a driving voltage VDD to the amplifier 360. When it is determined that there is a need to adjust the amplitude of a single-ended signal output from the amplifier 360, the wireless power transmitter 300 may operate a DC/DC converter or a voltage divider to change a gain of the amplifier 360, so that the amplitude of an output single-ended signal can be adjusted.

The matching unit 370 may include various devices for impedance matching, for example, at least one among at least one inductor and at least one capacitor. As described above, a relative location of the wireless power receiver with respect to the wireless power transmitter is variable. Accordingly, when the wireless power receiver is arranged on the wireless power transmitter, various impedances may be given. The wireless power transmitter 300 may increase the efficiency of wireless charging through impedance matching.

The resonance unit 380 may generate an electromagnetic field using a single-ended signal from the amplifier 360, to radiate the generated electromagnetic field to the outside. When the wireless power transmitter 300 operates on the basis of an A4WP standard scheme, the resonance unit 380 may be designed to have a resonance frequency of 6.78 MHz and may generate an electromagnetic field having a resonance frequency to radiate the generated electromagnetic field to the outside. The resonance unit 380 may include at least one inductor and at least one capacitor, which are included in a resonance circuit.

The sensing circuit 351 may sense an electrical characteristic, for example, at least one of a current value and a voltage value, of a single-ended signal in an input terminal of the resonance unit 380.

The ADC 353 may convert an analog value of at least one among a current value and a voltage value sensed by the sensing circuit 351 into a digital value, to output the converted value to the control unit 355.

The control unit 355 may use at least one among a current value and a voltage value of a single-ended signal to determine modulation information of the signals. For example, the control unit 355 may identify the phase of a single-ended signal using at least one among a current value and a voltage value of the single-ended signal. The control unit 355 may determine modulation information of a single-ended signal, for maintaining the phase of the signal at a pre-configured value. For example, the control unit 355 may determine modulation information allowing a single-ended signal to be delayed by t. The control unit 355 may output a control signal corresponding to determined modulation information to the modulation unit 356. The modulation unit 356 may delay a single-ended signal by interval t on the basis of the input control signal. Accordingly, the phase of the single-ended signal can be maintained at a pre-configured value. In another embodiment, the control unit 355, for example, may identify, using a digital value from the ADC 354, that the amplitude of a single-ended signal is A'. The control unit 355 may determine modulation information allowing the amplitude of a single-ended signal to be adjusted to be A, to output a control signal corresponding to the modulation information. For example, when the modulation unit 356 adjusts an amplitude, the control unit 355 may output a control signal for adjusting the amplitude to the modulation unit 356. In another embodiment, when the amplifier 360 adjusts an amplitude, the control unit 355 may output a control signal to a device, such as a DC/DC converter, a voltage divider, etc. arranged on a rail to which a driving voltage of the amplifier 360 is applied.

According to the above description, the modulation unit 356 may adjust a single-ended signal such that the phase of a single-ended signal is maintained at a pre-configured value, or the amplitude of the single-ended signal is maintained at a pre-configured value.

In various embodiments of the present disclosure, the amplifier 360, the matching unit 370, and the resonance unit 380 may be disposed at an outside of the signal adjustment unit 350. Also, the signal generation unit 358 may be disposed at an outside of the signal adjustment unit 350 or may be included in the signal adjustment unit 350, according to an embodiment. More specifically, when the signal generation unit 358 is implemented by a battery, the signal generation unit 358 may be disposed at an outside of the signal adjustment unit 350. When the signal generation unit 358 is implemented by a power interface, the signal generation unit 358 may be included in the signal adjustment unit 350.

Referring to FIG. 3C, the wireless power transmitter 300 may include the current sensing circuit 311, the voltage sensing circuit 312, the ADCs 313 and 314, the control unit 315, the modulation unit 316, the Power Amplifier (PA) driver 317, the signal generation unit 318, the amplifier 320, the matching unit 330, and the resonance unit 340.

As described above with reference to FIG. 3A, at least one element among elements included in the wireless power transmitter 300 may be implemented by one IC, like the single signal adjustment unit 310. Also, as in FIG. 3C, each of the elements may be implemented by separate hardware (for example, an analog device, an Integrated Circuit (IC), etc.). For example, the modulation unit 316, the PA driver 317, or the like may be implemented by hardware, such as a separate IC.

In addition, although not illustrated, respective elements included in the wireless power transmitter using a single-ended signal illustrated in FIG. 3B may be also implemented by separate hardware.

A detail description relating to each of elements illustrated in FIG. 3C will be omitted because the description is the same as that illustrated in FIG. 3A.

Figure 4:
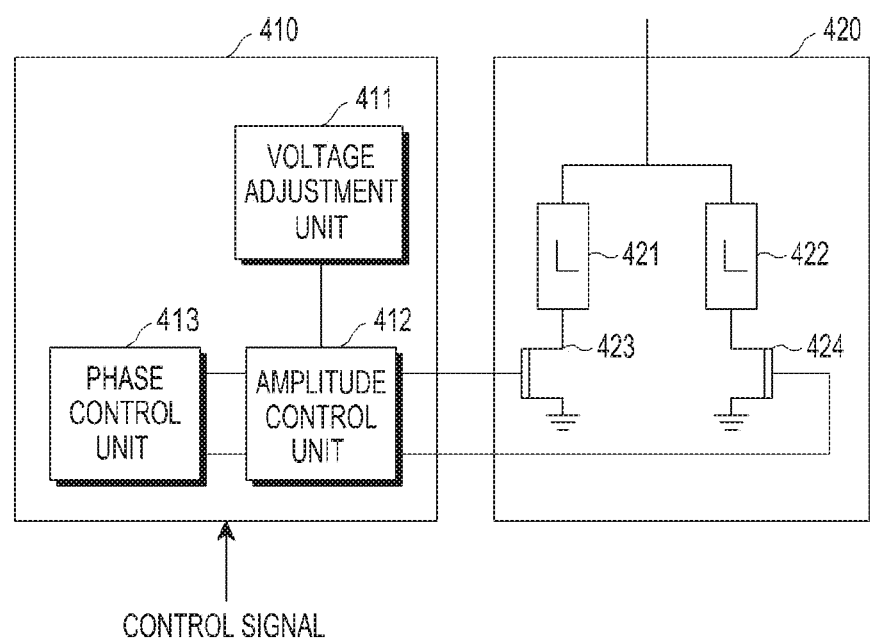
FIG. 4 illustrates a block diagram of a modulation unit according to various embodiments of the present disclosure.

FIG. 4 illustrates a block diagram of a modulation unit according to various embodiments of the present disclosure.

A modulation unit 410 may include a voltage adjustment unit 411, an amplitude control unit 412, and a phase control unit 413. In various embodiments of the present disclosure, the modulation unit 410 may control the phase of a differential signal in a digital scheme. Therefore, various digital control algorithms can be applied through an MCU or an FPGA, and the continuity of calibration and phase change can be ensured.

Figure 5:
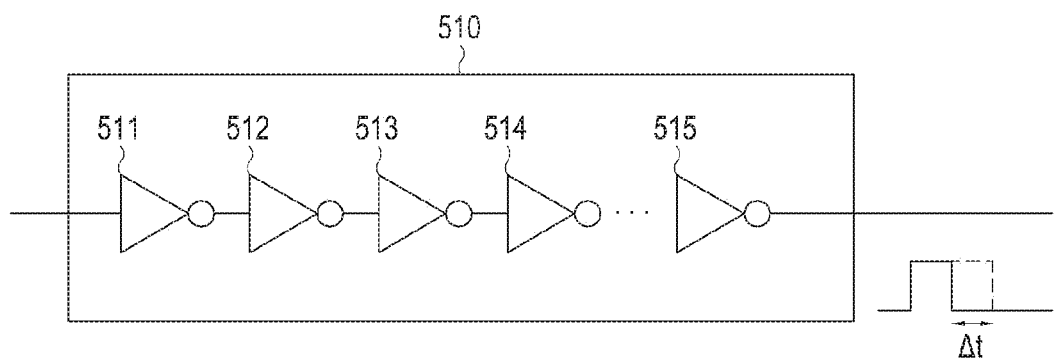
FIG. 5 illustrates a concept diagram of a phase control unit according to various embodiments of the present disclosure.

The phase control unit 413 may adjust the phase of at least one signal in a differential signal. In various embodiments of the present disclosure, the phase control unit 413 may include a delay device that can delay at least one signal. The phase control unit 413 may delay at least one signal for a delay time interval determined based on a control signal from the control unit. For example, FIG. 5 illustrates a concept diagram of a phase control unit according to various embodiments of the present disclosure. Referring to FIG. 5, a phase control unit 510 may include a plurality of delay devices 511 to 515. Some delay devices among the plurality of delay devices 511 to 515 may be controlled to be in an ON state, and a signal may be delayed by a delay time interval ($\Delta t$). The control unit may determine a delay time interval ($\Delta t$), determine the number of delay devices to be controlled to be in an ON state, on the basis of the determined delay time interval ($\Delta t$) and output a control signal. Accordingly, the phase control unit 413 may determine a first delay device corresponding to the determined number of delay devices among the plurality of delay devices 511 to 515. The phase control unit 413 may output an output of the first delay device to delay the signal by the determined delay time interval ($\Delta t$) and thus adjust the phase of the signal.

In various embodiments of the present disclosure, the phase control unit 413 may delay at least one signal among a first signal and a second signal, and a difference in phase between the first signal and the second signal may be maintained at 180 degrees.

Meanwhile, when the wireless power transmitter uses a single-ended signal instead of a differential signal, the control unit may output a control signal allowing the phase of the single-ended signal to have a pre-configured value. The phase control unit 413 may control at least some of delay devices to be in an ON state on the basis of the control signal, to delay a single-ended signal by a delay time interval ($\Delta t$) so as to enable the single-ended signal to have a phase of a pre-configured value.

The amplitude control unit 413 may adjust the amplitude of at least one signal in the differential signal using a driving voltage input from the voltage adjustment unit 411. For example, the amplitude control unit 413 may adjust the amplitude of at least one signal in the differential signal on the basis of the magnitude of a driving voltage input from the voltage adjustment unit 411. For example, the control unit may determine that the amplitude of at least one signal differs from a pre-configured value, and accordingly may output a control signal allowing the amplitude of the at least one signal to have a pre-configured value. The voltage adjustment unit 411 may adjust a driving voltage of the amplitude control unit 412 on the basis of the control signal output from the control unit, thereby adjusting the amplitude of a differential signal or a single-ended signal output from the amplitude control unit 412.

According to the above description, the modulation unit 410 may adjust at least one among the phase and the amplitude of a differential signal or a single-ended signal.

An amplifier 420 may be implemented by, for example, an amplifier of a class D or class E, and as illustrated, may include inductors 421 and 422 and FETs 423 and 424. A first signal having been modulated by the modulation unit 410 may be input to a gate of the FET 423, and a second signal having been modulated by the modulation unit 410 may be input to a gate of the FET 424. The inductors 421 and 422 may be connected to an output terminal of the amplifier 420, and the inductors 421 and 422 may be connected to drains of the FETs 423 and 424, respectively.

FIG. 4 illustrates that the phase of a differential signal input to the modulation unit 410 is adjusted through the phase control unit 413, and then the amplitude of the phase-adjusted differential signal is adjusted through the amplitude control unit 412. However, the description merely corresponds to an example for explanation, and the present disclosure is not limited thereto. The amplitude of a differential signal input to the modulation unit 410 may be adjusted through the amplitude control unit 412, and then the phase of the amplitude-adjusted differential signal may be adjusted through the phase control unit 413. Each of signals included in a differential signal, at least one of the phase and the amplitude of which has been adjusted through the modulation unit 410, may be output to the input terminal of the amplifier 420.

Figure 6:
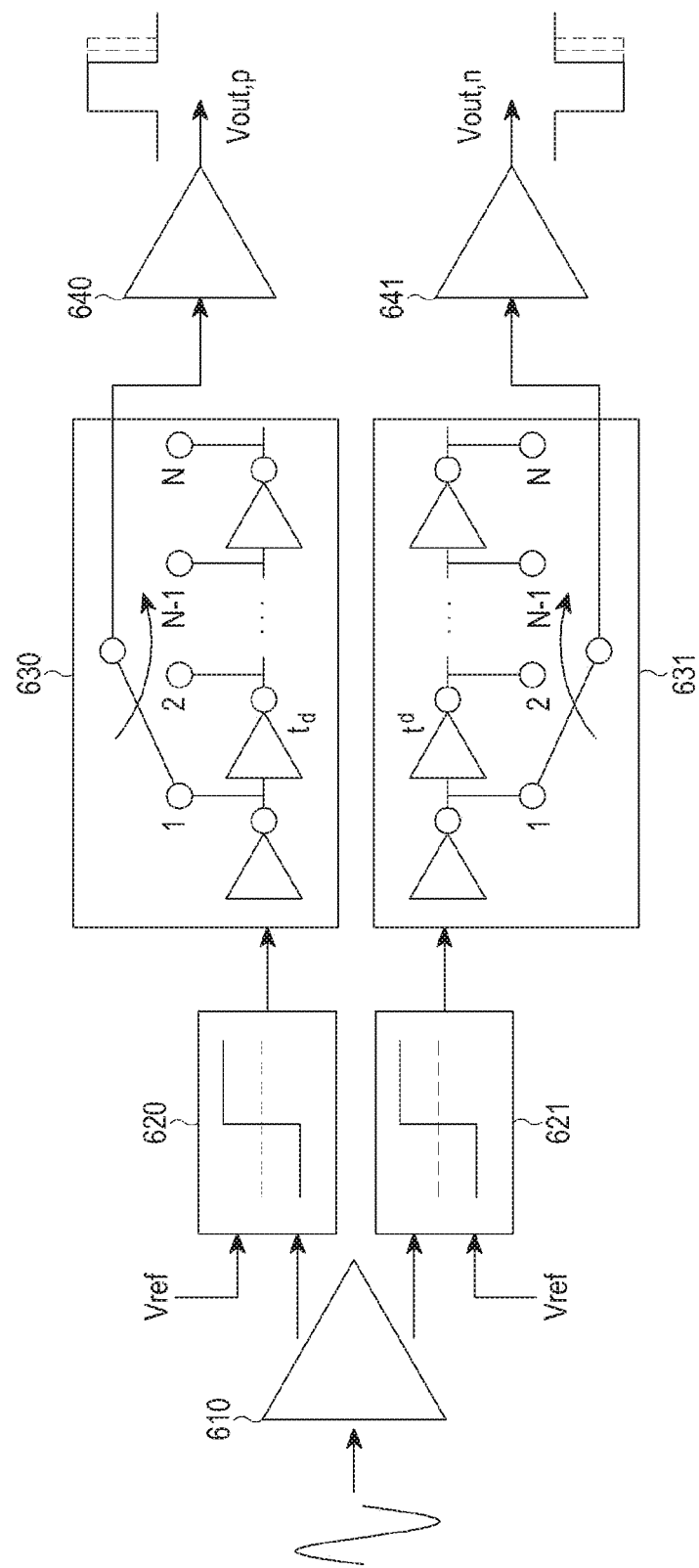
FIG. 6 illustrates a concept diagram of various phase control units of the present disclosure.

FIG. 6 illustrates a concept diagram of a signal generation unit and a phase control unit according to various embodiments of the present disclosure.

Referring FIG. 6, a phase control unit may include a first phase delay circuit 630, a second phase delay circuit 631, a first buffer 640, and a second buffer 641. A signal generation unit that outputs a differential signal to the phase control unit may include a differential signal generation unit 610, a first comparator 620, and a second comparator 621.

The differential signal generation unit 610 may receive a single-ended signal to output a differential signal. For example, the differential signal generation unit 610 may include a single to differential (S2D) circuit, may generate a differential signal using the S2D circuit and output the generated signal. A first signal and a second signal included in the differential signal may have a phase difference of 180 degrees.

The first signal and the second signal included in the generated differential signal may be changed to have a shape of a square wave by passing through the first comparator 620 and the second comparator 621, respectively. Because an input signal is a differential signal having a difference of 180 degrees, outputs of the two comparators 620 and 621 is a differential square wave in which phases have a difference of 180 degrees.

The phase control unit may include a first phase control unit and a second phase control unit that respectively adjusts the phases of the first signal and the second signal that supplies the differential signal. The first phase control unit may include the first phase delay circuit 630 and the first buffer 640, and the second phase control unit may include the second phase delay circuit 631 and the second buffer 641.

Each of the first phase delay circuit 630 and the second phase delay circuit 631 may include one or more delay devices connected thereto in series. For example, the first phase delay circuit 630 may include at least one first delay device connected in series among a plurality of delay devices included in the phase control unit, and may adjust the phase of the first signal by delaying the phase of the first signal through the at least one first delay device. For example, the second phase delay circuit 631 may include at least one second delay device connected in series among a plurality of delay devices included in the phase control unit, and may adjust the phase of the second signal by delaying the phase of the second signal through the at least one second delay device.

The first phase delay circuit 630 and the second phase delay circuit 631 may delay at least one among a square wave of a first signal and a square wave of a second signal. In various embodiments of the present disclosure, the first phase delay circuit 630 and the second phase delay circuit 631 may be operated in a digital dimension, and may control the phase of a signal in a shape of continuous and monotonous increase and decrease according to a digital control input from the outside. In an embodiment of FIG. 6, the first phase delay circuit 630 and the second phase delay circuit 631 may be implemented by a structure including an analog switch. Depending on a position to which the analog switch is connected, the number of delay devices which operate in an ON state in each of the first phase delay circuit 630 and the second phase delay circuit 631 may be determined, and accordingly a delay time interval (td) may be determined.

The first buffer 640 and the second buffer 641 may temporarily store the first signal and the second signal, the phases of which have been adjusted, respectively, and then output the stored signals. Each of the phase-adjusted first signal and second signal may be output to an input terminal of an amplifier, or may be output to an amplitude control unit that adjusts the amplitude of a differential signal.

Meanwhile, when a Vref voltage which is a comparison voltage of each of the comparators 620 and 621 is adjusted, a reference voltage switching between a voltage of "1" and a voltage of "0" is changed to enable the adjustment of a duty cycle of a square wave.

Figure 7:
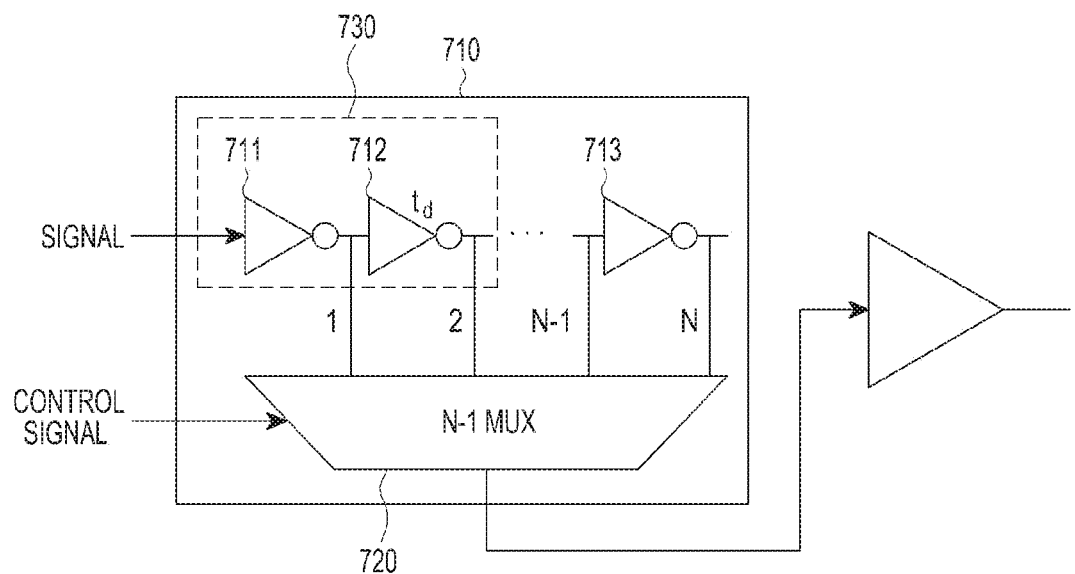
FIG. 7 illustrates a concept diagram of a delay device according to various embodiments of the present disclosure.

FIG. 7 illustrates a concept diagram of a phase control unit according to various embodiments of the present disclosure.

As illustrated in FIG. 7, a phase control unit 710 may include one or more inverters 711, 712 and 713 and a multiplexer (MUX) 720. When the number of inverters 711, 712, and 713 is N, the number of channels of the multiplexer may be N−1. The multiplexer 720 may determine an inverter to be controlled to be in an ON state, on the basis of an input control signal, and may output a control signal that controls the determined inverter to be in ON state.

Hereinafter, it is presumed that a first signal is adjusted by a first phase control unit and a second signal is adjusted by a second phase control unit. The first phase control unit may include at least one first inverter and a first multiplexer, and the second phase control unit may include at least one second inverter and a second multiplexer. Also, it is presumed that the first phase control unit may control inverters up to the m-th first inverter to be in an ON state on the basis of a control signal and the second phase control unit may control inverters up to the n-th second inverter to be in an ON state on the basis of a control signal.

When a delay time of each of the first inverter and the second inverter is td, an output of the m-th first inverter is a signal having a delay time interval of m×td compared to an input signal. The first signal may pass through m number of inverters, thereby having a delay time interval of m×td. Also, an output of the m-th inverters corresponding to the first signal which has been delayed by a time interval of m×td may be output through a multiplexer.

The second signal may pass through n number of inverters, thereby having a delay time interval of n×td. An output of the n-th inverters corresponding to the second signal which has been delayed by a time interval of n×td may be output through a multiplexer. A difference in time between an output (Vout, p) of the first phase control unit, which is an output of the m-th inverter, and an output (Vout, n) of the second phase control unit, which is an output of the n-th inverter may be a time difference of T/2+(n−m) td obtained by adding a time difference of T/2 due to a phase difference of 180 degrees, and a time difference of (n−m)×td. That is, when calculated based on phases, a differential signal including a first signal and a second signal having a phase difference of 180°+((n−m)td/T)×360° can be generated. Then, when n and m are controlled by a digital control, a differential signal having a phase difference continuously and monotonously increasing and decreasing may be created. A maximum range of a phase control is a difference between a case where an output of the first phase control unit is a minimum delay and an output of the second phase control unit is a maximum delay, and the opposite case. Therefore, a value of (2Ntd/T)×360° is a phase difference control range in which a phase difference can be maximally controlled. It is presumed that N is the number of inverters included in a phase control unit, and the number of inverters included in each of the first phase control unit and the second phase control unit is identically N. When the number of inverters included in each of the first phase control unit and the second phase control unit is different, a phase difference control range in which a phase difference is maximally controllable may be determined in the same method.

In relation to a controllable minimum phase difference control precision, an increase in the number of inverters in a case of control may increase the phase control precision, which is defined by td/T×360°. That is, a time delay of an inverter may be adjusted to determine a phase control precision, and the number of inverters may be adjusted to adjust a maximum phase control range. In order to perform N number of controls, a control signal of k bits may be input to a multiplexer from the outside by a digital control. Then, N number of outputs of respective inverters may be selectively output through a multiplexer.

Figure 8:
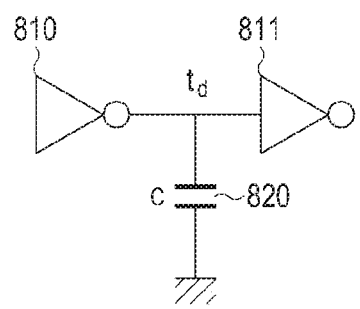
FIG. 8 illustrates a concept diagram of a delay device according to various embodiments of the present disclosure.

FIG. 8 illustrates a concept diagram of a phase control unit according to various embodiments of the present disclosure.

As illustrated in FIG. 8, a phase control unit may include one or more inverters 810 and 811. The phase control unit of FIG. 8 may include a capacitor disposed between an output terminal of the inverter 810, an input terminal of the inverter 811, and a ground terminal. For example, the phase control unit may include a capacitor 820, one end of which is connected between the inverter 810 and the inverter 811, and the other end of which is grounded. The capacitor 820 may perform charging and discharging, and thus may additionally delay a signal. Meanwhile, in various embodiments of the present disclosure, the capacitor 820 may be implemented by a variable capacitor.

A capacitance of the capacitor may be adjusted on the basis of a control signal generated by the control unit. The phase control unit may determine one inverter among one or more inverters on the basis of the control signal, output an output of the determined inverter and adjust the capacitance of the capacitor, so as to precisely control the phase of a differential signal.

Figure 9A:
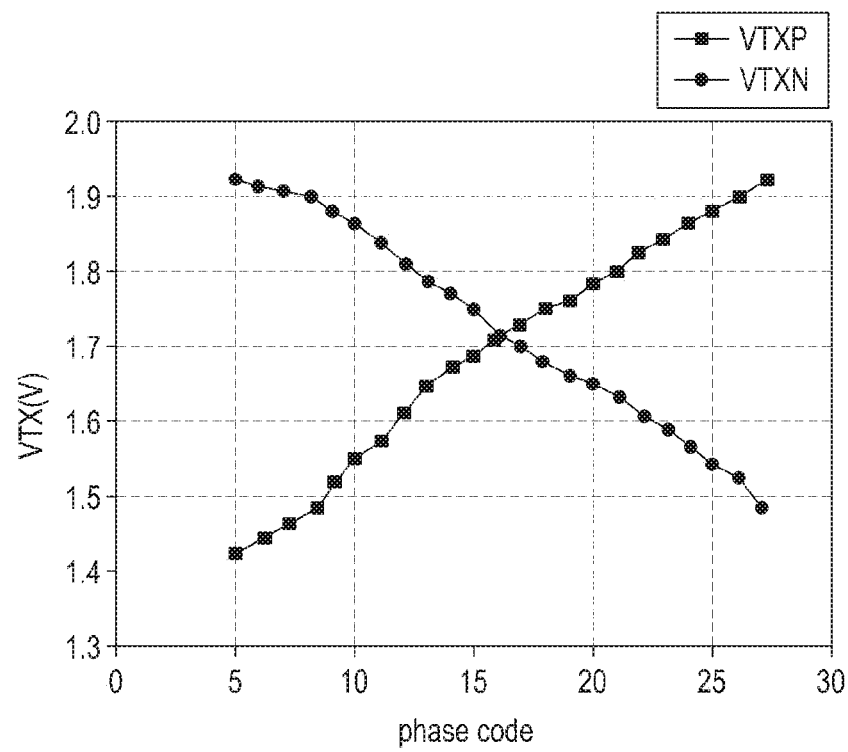
FIG. 9A illustrates a graph showing a change of the magnitude of each differential output voltage depending on a phase difference control.

FIG. 9A illustrates a change of a time delay, that is a phase delay of a square wave in a wireless power transmitter including devices of a CMOS process according to various embodiments of the present disclosure, in a resonance frequency of 6.78 Mhz.

It is noted that the efficiency of an amplifier is affected by the amplitude of a PWM signal, which is an input signal of the amplifier, as well as the phase and a power source VDD of the amplifier.

FIG. 9A illustrates a graph showing a change of the magnitude of each differential output voltage depending on a phase difference control. FIG. 9A illustrates a correlation between a phase difference control code and a VTXP and a VTXN (P implies positive, and N implies negative) which are differential output voltages. The phase difference control code may mean a digital code which can control a difference in phase between differential outputs.

As noted from FIG. 9A, as a phase difference control code is increased, the VTXP is increased and the VTXN is decreased, and as a phase difference control code is decreased, the VTXP is decreased and the VTXN is increased. Therefore, the magnitude of a VTXP and a VTXN is sensed and the control unit performs a phase difference control depending on the magnitude of each of them, so that the symmetry of an output differential signal can be ensured.

Figure 9B:
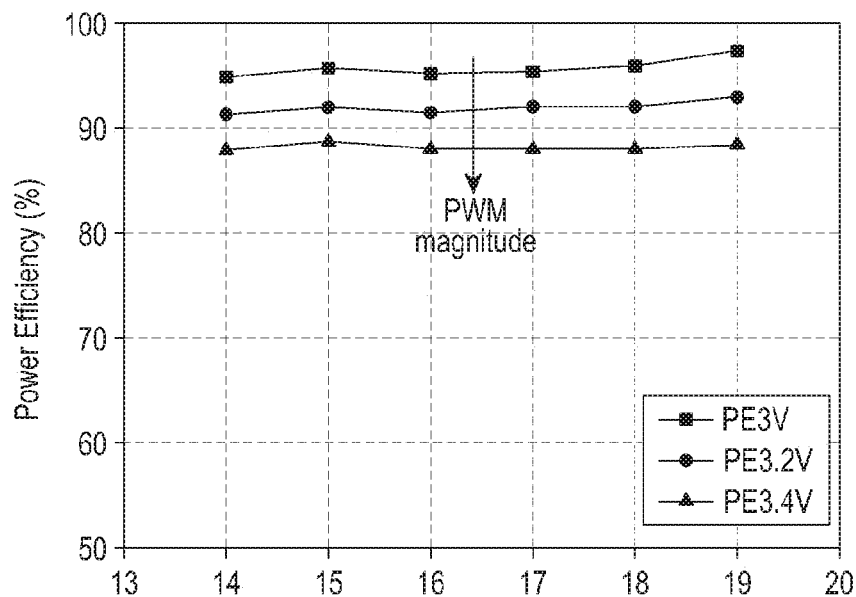
FIG. 9B illustrates a graph showing that the efficiency of an amplifier is changed depending on the amplitude of a driving voltage.

FIG. 9B illustrates a measurement result for explaining FIG. 9A. As noted from FIG. 9B, as the amplitude of a PWM changes to 3V/3.2V/3.4V, the efficiency of an amplifier changes. Therefore, a power efficiency is required to be optimized through controlling of the amplitude of a PWM signal. In order to implement the optimization, a VDD, which is a power source of a logic circuit, such as an inverter, an EXOR, etc., that may be generally used to make a PWM signal of a power amplifier, is controlled by a DC-DC converter, etc., and thus is optimized. Therefore, the efficiency of the power amplifier can be maximized. That is, both a phase control and a control of a power source of a logic circuit are performed so as to optimize the efficiency of the power amplifier.

FIG. 9B illustrates a graph showing that the efficiency of an amplifier is changed depending on the amplitude of a driving voltage. Referring to FIG. 9B, an optimal amplitude for obtaining a relatively high power efficiency exists. Therefore, a wireless power transmitter may process a signal to have the optimal amplitude. More specifically, when the amplitude of a detected signal does not correspond to an optimal amplitude, the control unit may control the amplitude to adjust the amplitude of an output differential signal or single-ended signal.

FIGS. 10A to 10G illustrate circuit diagrams of a PA driver according to various embodiments of the present disclosure. In various embodiments of the present disclosure, when a harmonic wave having a high momentary peak current is generated in a wireless power transmitter, the harmonic wave may be attenuated by an inductor so as to reduce EMI radiation. Also, when a circuit of an MOS or a BJT is included in a wireless power transmitter, a capacitor may be disposed between a gate and a drain or a base and a collector of a current source circuit, to enable feedback and thus alleviate a peak current of a harmonic wave. Furthermore, a wireless power transmitter may include a complementary device, such as a CMOS, and may be operable in a low power by a complementary device of a NMOS and a PMOS. For example, when a signal is not input because an output or a driving circuit of an inverter structure is established, an operation in a low power can be achieved through preventing of a current flow.

Figure 10A:
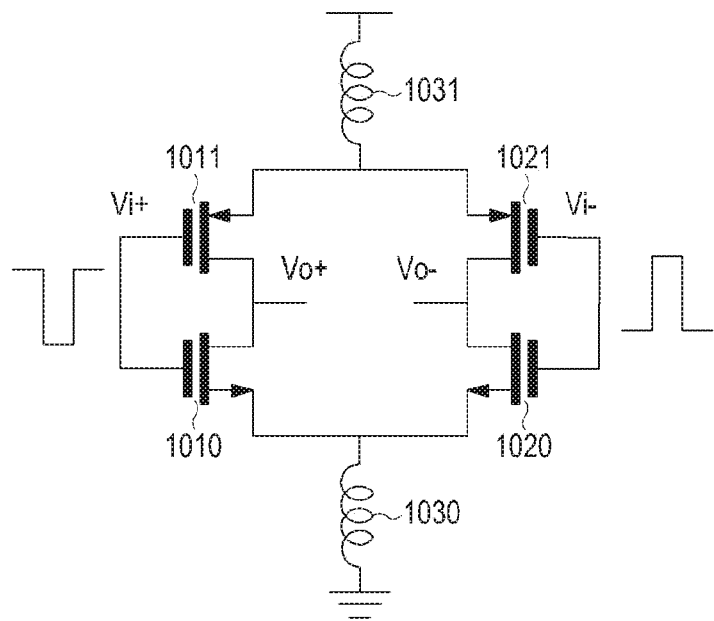
FIGS. 10A to 10G illustrate circuit diagrams of a PA driver according to various embodiments of the present disclosure.

Referring to FIG. 10A, a PA driver may include a plurality of transistors 1010, 1011, 1020, and 1021 and inductors 1030 and 1031. For example, a drain terminal of the first P-MOSFET 1011 is connected to a drain terminal of the first N-MOSFET 1010. The first N-MOSFET 1010 and the first P-MOSFET 1011 may receive a first signal in a differential signal through respective gates thereof. Also, the first N-MOSFET 1010 and the first P-MOSFET 1011 may process the first signal to output a signal having a voltage of V0+.

A drain terminal of the second P-MOSFET 1021 is connected to a drain terminal of the second N-MOSFET 1020. The second N-MOSFET 1020 and the second P-MOSFET 1021 may receive a second signal in a differential signal through respective gates thereof. The second N-MOSFET 1020 and the second P-MOSFET 1021 may process the second signal to output a signal having a voltage of V0−.

Also, the first inductor 1031 may be connected to a source of the first P-MOSFET 1011 and a source of the second P-MOSFET 1021, and the second inductor 1030 may be connected to a source of the first N-MOSFET 1010 and a source of the second N-MOSFET 1020.

Generally, a wireless power transmitter transmits a relatively large power. Therefore, a relatively large voltage swing and current swing may occur in the wireless power transmitter. Accordingly, a large AC current flows momentarily in the wireless power transmitter, whereby a problem that a large noise signal of a high frequency is radiated or flows may occur. Especially, when a wireless power transmitter uses a class D or E amplifier operated by switching, a voltage signal is a square wave, shifting from 0V to VDD, or from VDD to 0V. Therefore, a peak current having a relatively large size may occur. A generated peak current may cause a power noise by flowing to a ground terminal for grounding or a driving power input terminal of the PA driver, and the power noise is transferred through another circuit and a substrate, thereby aggravating a noise problem.

The sources or the emitter terminals of the plurality of transistors 1010, 1011, 1020, and 1021 are connected to each other to become common. Therefore, peak currents having opposite signs may occur from momentary transition of an input voltage and then be offset. Accordingly, a noise signal of a peak current may be prevented from being transferred to a ground terminal or a driving power input terminal of the PA driver. The peak current may be removed by the inductors 1030 and 1031 connected in series to a ground terminal or a driving power input terminal of the PA driver, respectively.

Figure 10B:
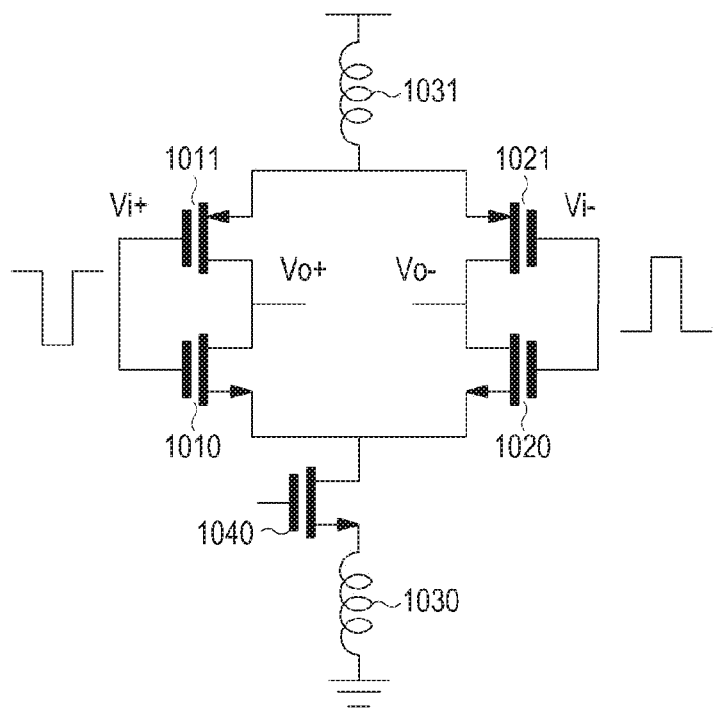
Figure 10C:
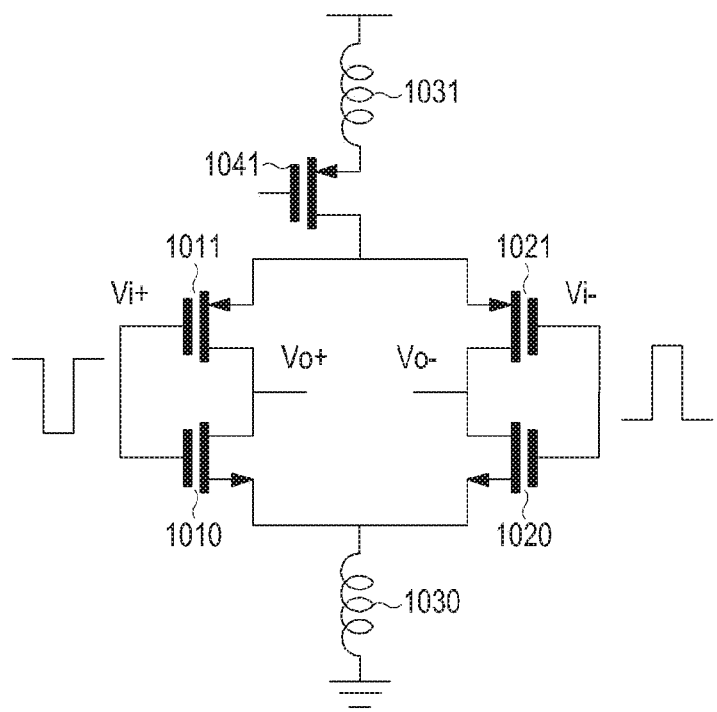
Figure 10D:
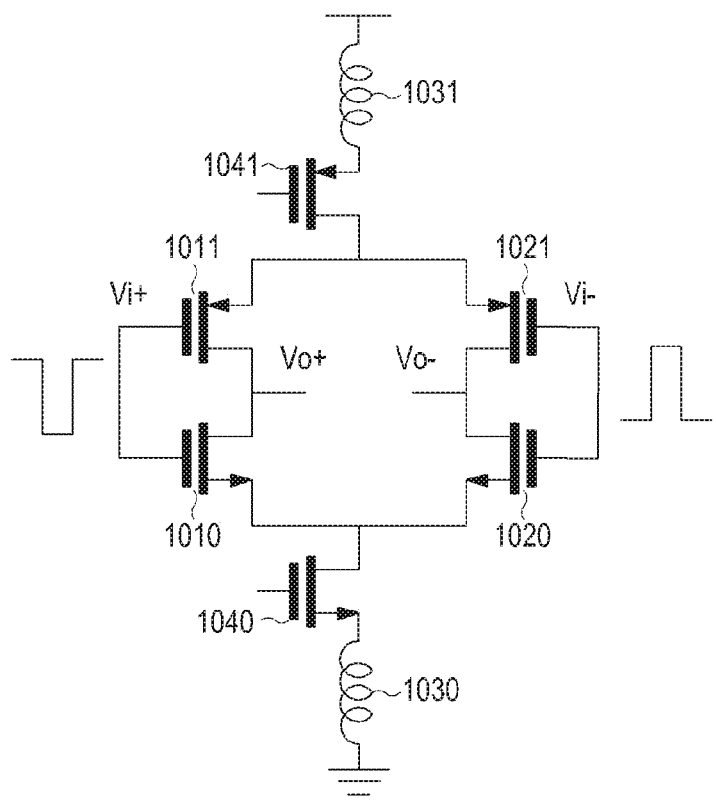

FIGS. 10B to 10D illustrate circuit diagrams of a PA driver additionally including a transistor current source. In an embodiment of FIG. 10B, a third N-MOSFET 1040 may be disposed between the first N-MOSFET 1010 and the second N-MOSFET 1020. For example, the sources of the first N-MOSFET 1010 and the second N-MOSFET 1020 may be connected to a drain of the third N-MOSFET 1040. The second inductor 1030 may be connected to a source of the third N-MOSFET 1040. In an embodiment of FIG. 10C, a third P-MOSFET 1041 may be disposed between the first P-MOSFET 1011 and the second P-MOSFET 1021. For example, the source of each of the first P-MOSFET 1011 and the second P-MOSFET 1021 may be connected to a drain of the third P-MOSFET 1041. The first inductor 1031 may be connected to a source of the third P-MOSFET 1041. In an embodiment of FIG. 10D, the sources of the first N-MOSFET 1010 and the second N-MOSFET 1020 may be connected to the drain of the third N-MOSFET 1040. The second inductor 1030 may be connected to the source of the third N-MOSFET 1040. In addition, the source of each of the first P-MOSFET 1011 and the second P-MOSFET 1021 may be connected to the drain of the third P-MOSFET 1041. The first inductor 1031 may be connected to the source of the third P-MOSFET 1041.

Figure 10E:
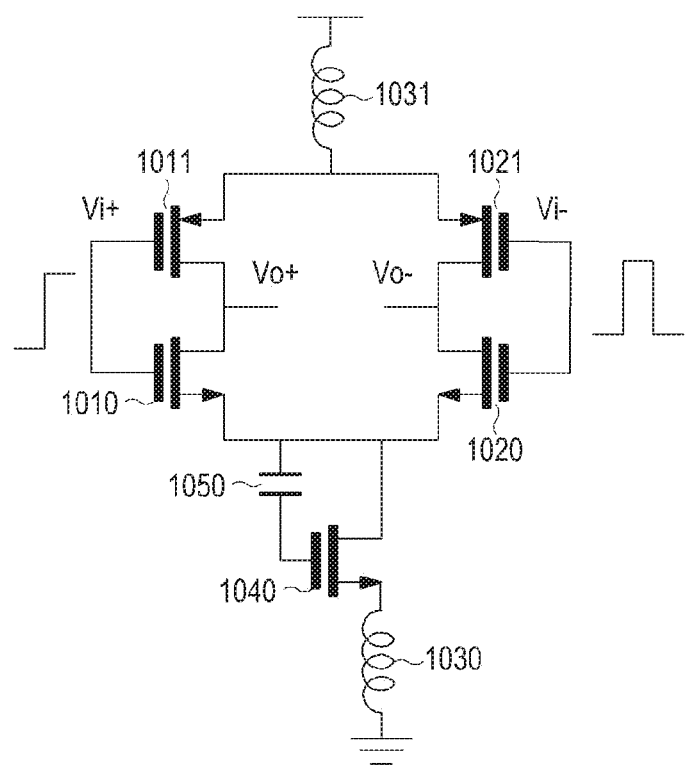
Figure 10F:
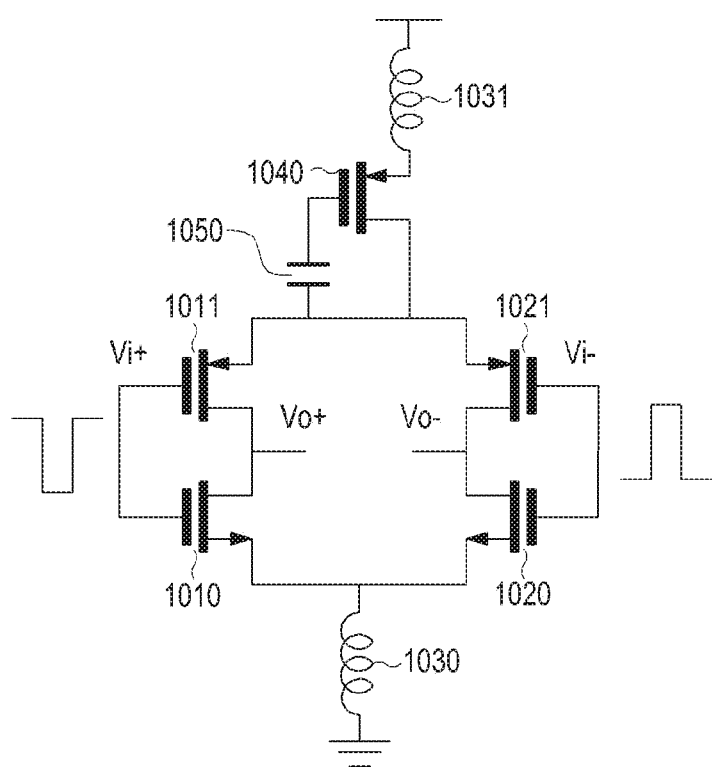
Figure 10G:
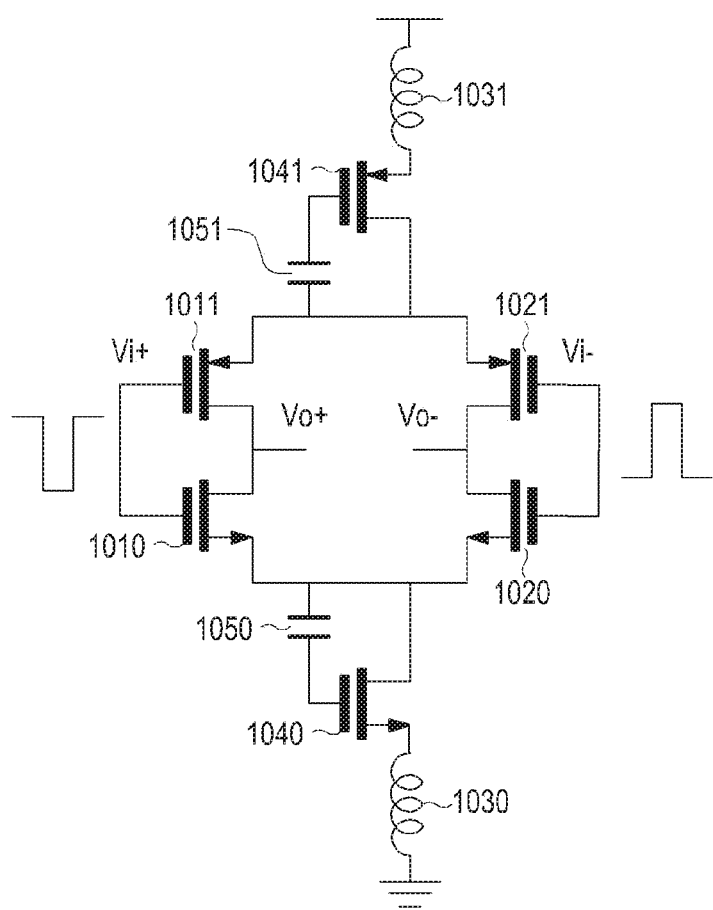

FIGS. 10E to 10G illustrate circuit diagrams of a PA driver additionally including a transistor current source and a capacitor. In an embodiment of FIG. 10E, the sources of the first N-MOSFET 1010 and the second N-MOSFET 1020 may be connected to the drain of the third N-MOSFET 1040. The second inductor 1030 may be connected to the source of the third N-MOSFET 1040. Meanwhile, a first capacitor 1050 may be disposed between the source of each of the first N-MOSFET 1010 and the second N-MOSFET, and a gate of the third N-MOSFET 1040. For example, the sources of the first N-MOSFET 1010 and the second N-MOSFET 1020 may be connected to one end of the first capacitor 1050. The gate of the third N-MOSFET 1040 may be connected to the other end of the first capacitor 1050. In an embodiment of FIG. 10F, the drain of the third P-MOSFET 1041 may be connected to the source of each of the first P-MOSFET 1011 and the second P-MOSFET 1021. The first inductor 1031 may be connected to the source of the third P-MOSFET 1041. A second capacitor 1051 may be disposed between the source of each of the first P-MOSFET 1011 and the second P-MOSFET 1021, and a gate of the third P-MOSFET. For example, the source of each of the first P-MOSFET 1011 and the second P-MOSFET 1021 may be connected to one end of the second capacitor 1051. The gate of the third P-MOSFET 1041 may be connected to the other end of the capacitor 1051. In an embodiment of FIG. 10G, the sources of the first N-MOSFET 1010 and the second N-MOSFET 1020 may be connected to the drain of the third N-MOSFET 1040. The second inductor 1030 may be connected to the source of the third N-MOSFET 1040. Meanwhile, the sources of the first N-MOSFET 1010 and the second N-MOSFET 1020 may be connected to one end of the first capacitor 1050. The gate of the third N-MOSFET 1040 may be connected to the other end of the first capacitor 1050. The drain of the third P-MOSFET 1041 may be connected to the source of each of the first P-MOSFET 1011 and the second P-MOSFET 1021. The first inductor 1031 may be connected to the source of the third P-MOSFET 1041. Meanwhile, the source of each of the first P-MOSFET 1011 and the second P-MOSFET 1021 may be connected to one end of the second capacitor 1051. The gate of the third P-MOSFET 1041 may be connected to the other end of the second capacitor 1051. A capacitor is additionally included, so that a peak current may be alleviated.

A momentary peak current may momentarily increase a drain voltage of a MOSFET. However, a gate voltage is also increased, so that the impedance of the MOSFET may be decreased. In this case, a transition phenomenon due to a capacitor or a resistor which are parasitic on a circuit may decrease the magnitude of a momentary peak current, or voltage. Therefore, a spike-shaped harmonic current, voltage noise transferred to a ground or a driving power input terminal of the PA driver may be decreased.

A signal may be output to an amplifier through the PA drivers illustrated in FIGS. 10A to 10G, and the amplifier may amplify the signal in which a noise has been removed through the PA driver.

In addition, FIGS. 10A to 10G illustrate PA drivers for a differential signal, but the present disclosure is not limited thereto. The PA drivers may be implemented to be suitable to a single-ended signal. For example, in a case of a single-ended signal, the second N-MOSFET 1020 and the second P-MOSFET 1021 may be removed from FIGS. 10A to 10G.

In addition, CMOS transistors are illustrated in FIGS. 10A to 10G, but this merely corresponds to an example for explanation. Further, it is clear to a person ordinarily skilled in the corresponding technical field that the transistors may be implemented through other kinds of transistors, such as a Bipolar Junction Transistor (BJT) by the same method.

Figure 11A:
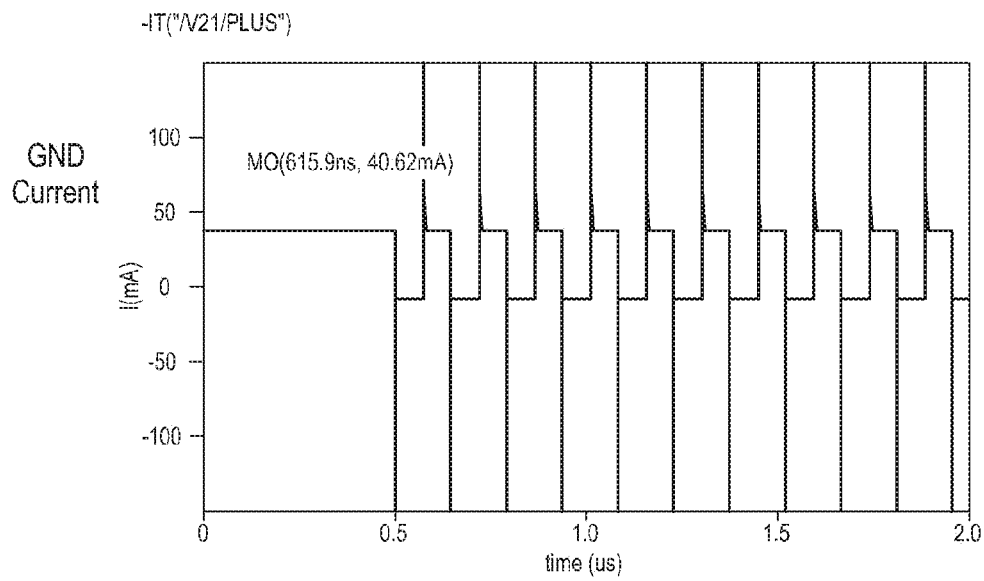
FIG. 11 illustrates a waveform of a signal before and after a noise is removed from the signal through a PA driver according to various embodiments of the present disclosure.
Figure 11B:
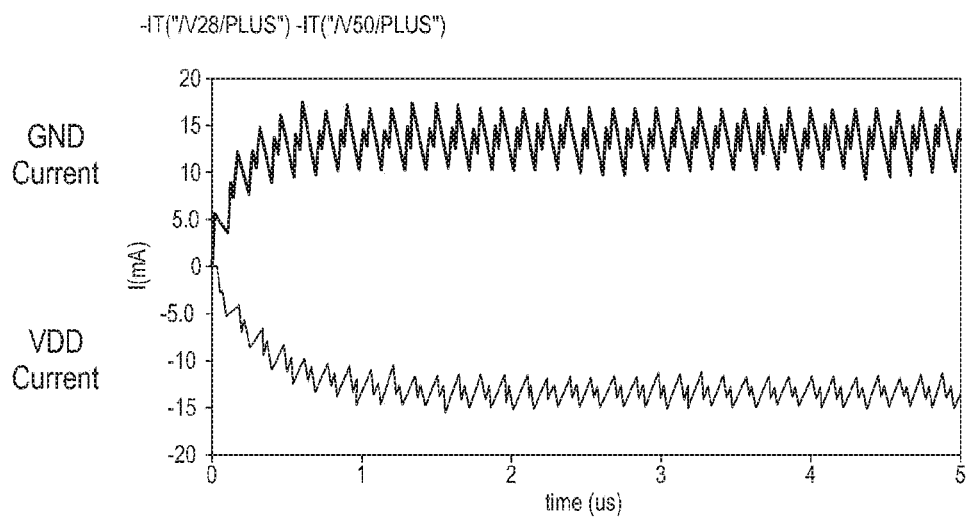

FIG. 11 illustrates a waveform of a signal before and after a noise is removed from the signal through a PA driver according to various embodiments of the present disclosure.

(a) of FIG. 11 illustrates a waveform of a signal before a noise is removed from the signal through a PA driver. As the waveform of a signal illustrated in (a) of FIG. 11, a wireless power transmitter transmits a relatively large power. Therefore, a relatively large voltage swing and current swing may occur in the wireless power transmitter. Especially, when a wireless power transmitter uses a class D or E amplifier operating by switching, a voltage signal is a square wave, changing from 0V to VDD, or from VDD to 0V. Therefore, a peak current having a relatively large size may occur as the waveform of a signal illustrated in (a) of FIG. 11.

(b) of FIG. 11 illustrates a waveform of a signal after a noise is removed from the signal through a PA driver. As the waveform of a signal illustrated in (b) of FIG. 11, when a harmonic wave having a high momentary peak current is generated in a wireless power transmitter, the harmonic wave may be attenuated by an inductor so as to reduce EMI radiation. Also, when a circuit of an MOS or a BJT is included in a wireless power transmitter, a capacitor may be disposed between a gate and a drain or a base and a collector of a current source circuit, to enable feedback and thus alleviate a peak current of a harmonic wave, as the waveform of a signal illustrated in (b) of FIG. 11.

Figure 12:
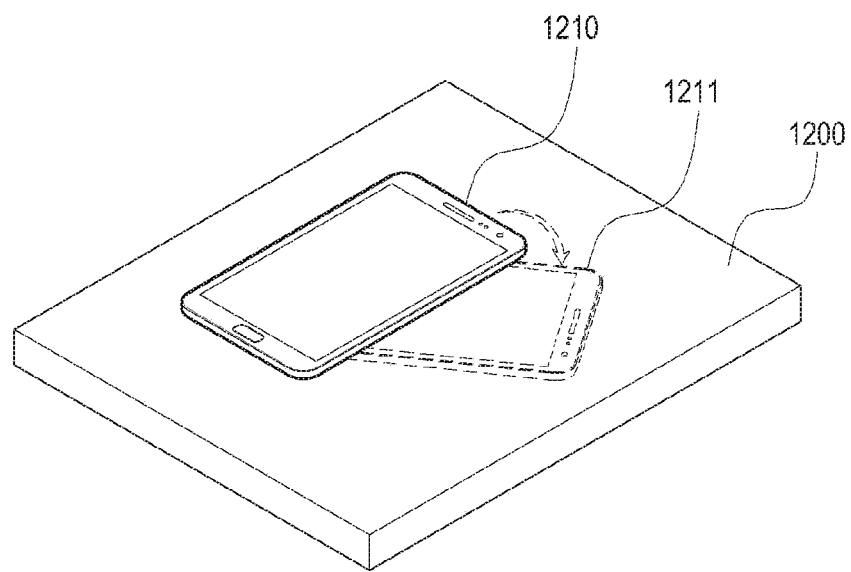
FIG. 12 is a diagram for explaining a method of detecting a change of the location of a wireless power receiver on a wireless power transmitter according to various embodiments of the present disclosure.

FIG. 12 is a diagram for explaining a method of detecting a change of the location of a wireless power receiver on a wireless power transmitter according to various embodiments of the present disclosure.

According to various embodiments of the present disclosure, a wireless power transmitter 1200 may detect a change of the location of a wireless power receiver. The wireless power transmitter 1200 may detect a change of resonance impedance due to a change of a relative location with respect to the wireless power receiver. As described above, the wireless power transmitter 1200 may detect a change of resonance impedance, and may detect a change of the location of the wireless power receiver on the basis of the detected change of resonance impedance.

For example, when the wireless power receiver is moved from a first location 1210 to a second location 1211, the wireless power transmitter 1200 may detect a change of resonance impedance, and may detect that the wireless power transmitter is moved from the first location 1210 to the second location 1211, on the basis of the detected change of resonance impedance.

Figure 13A:
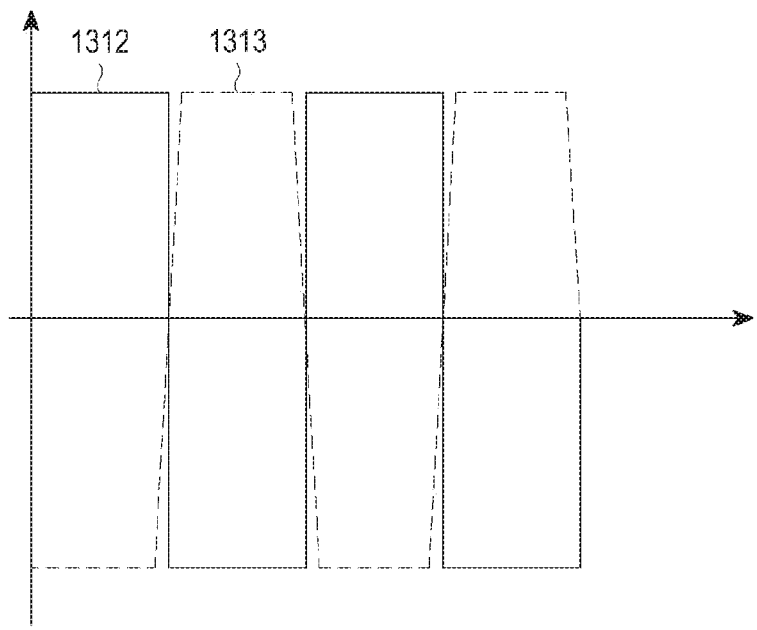
FIGS. 13A to 13C illustrates signal waveforms according to a comparative example.
Figure 13B:
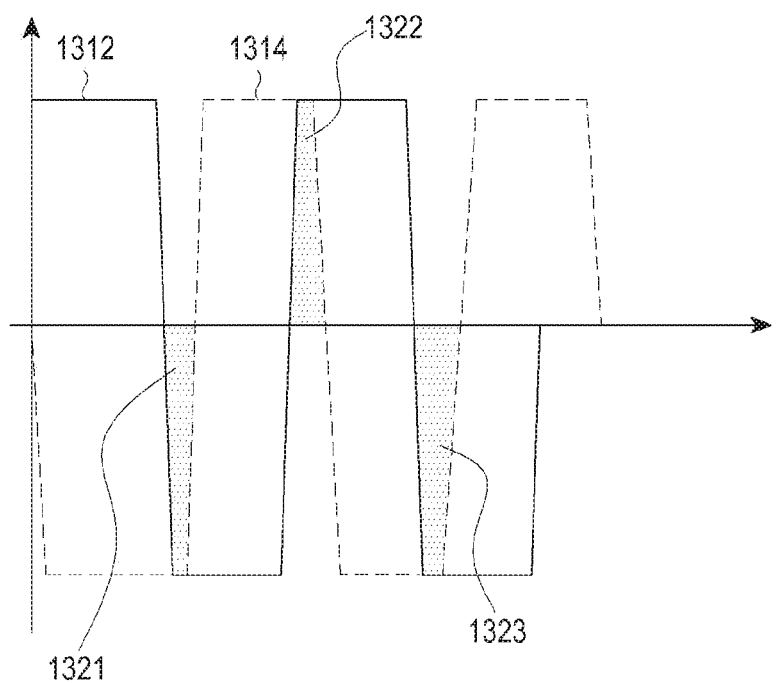
Figure 13C:
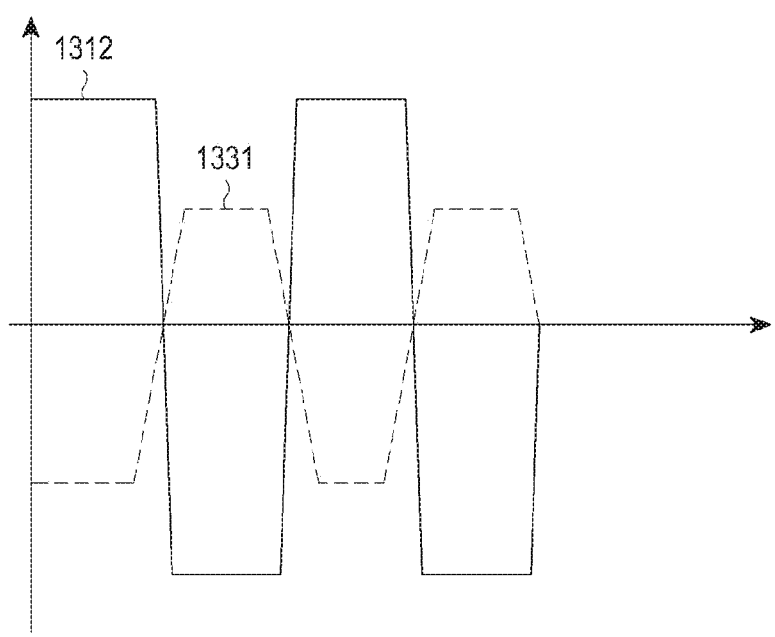

FIGS. 13A to 13C illustrates signal waveforms according to a comparative example.

FIG. 13A illustrates a first waveform 1312 and a second waveform 1313 with respect to a first signal and a second signal included in a differential signal amplified through an amplifier. The first waveform 1312 of the first signal may have a shape of a square wave, and the second waveform 1313 of the second signal may have a shape of a square wave. As described above, the first signal and the second signal may have a phase difference of 180 degrees, and accordingly, as noted from the attached drawings, the first waveform 1312 and the second waveform 1313 are illustrated to have a phase difference of 180 degrees.

Meanwhile, for example, when a resonance impedance of the wireless power transmitter changes due to the environment around a resonator or around an antenna, such as a change of the location of the wireless power receiver, etc., a difference in phase between a first signal and a second signal may not be maintained at 180 degrees. As noted from FIG. 13B, a second waveform 1314 corresponding to the second signal is moved to a right side, compared to FIG. 13A. Accordingly, it is noted that the first waveform 1312 and the second waveform 1314 fail to maintain a phase difference therebetween of 180 degrees. Since the first waveform 1312 and the second waveform 1314 fail to maintain a phase difference therebetween of 180 degree, portions 1321, 1322, and 1323 in which a part of the first waveform 1312 and a part of the second waveform 1314 overlap may occur. As portions 1321, 1322, and 1323 in which a part of the first waveform 1312 and a part of the second waveform 1314 overlap occur, EMI can be increased, and the efficiency of wireless charging can be decreased.

In addition, when a resonance impedance of the wireless power transmitter changes due to the environment around a resonator or around an antenna, such as a change of the location of the wireless power receiver, etc., the magnitudes of the amplitudes of a first signal and a second signal may differ from each other. As noted from FIG. 13C, the amplitude of a second waveform 1331 corresponding to the second signal has became smaller in comparison with FIG. 13A. Accordingly, it is noted that the amplitudes of the first waveform 1312 and the second waveform 1331 have became different from each other. The efficiency of wireless charging of the wireless power transmitter changes according to the amplitudes of the first signal and the second signal. As the amplitudes of the first waveform 1312 and the second waveform 1331 become different, the efficiency of wireless charging can be decreased.

Figure 14A:
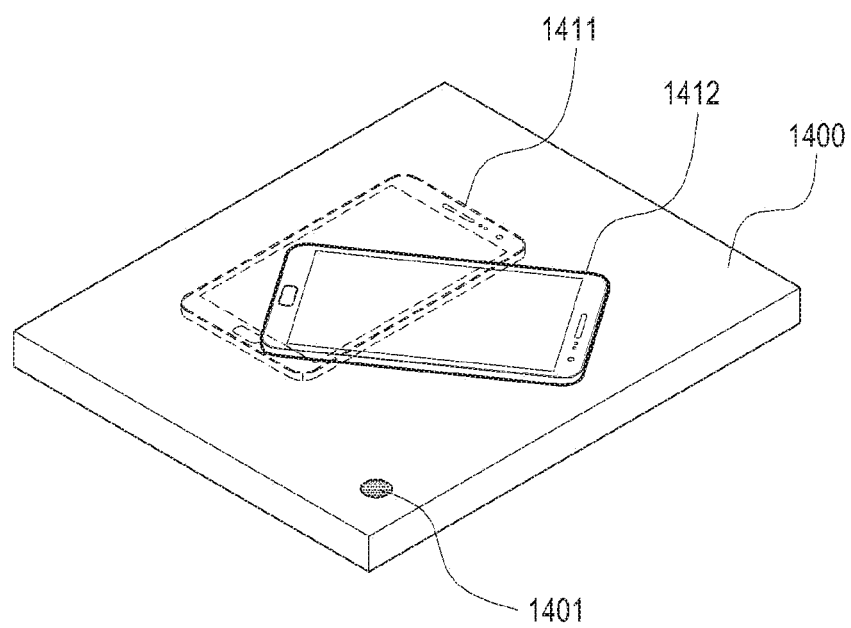
FIGS. 14A and 14B are diagrams for explaining a method for notifying of a state where a location of a wireless power receiver on a wireless power transmitter has deviated from a pre-configured location, according to various embodiments of the present disclosure.
Figure 14B:
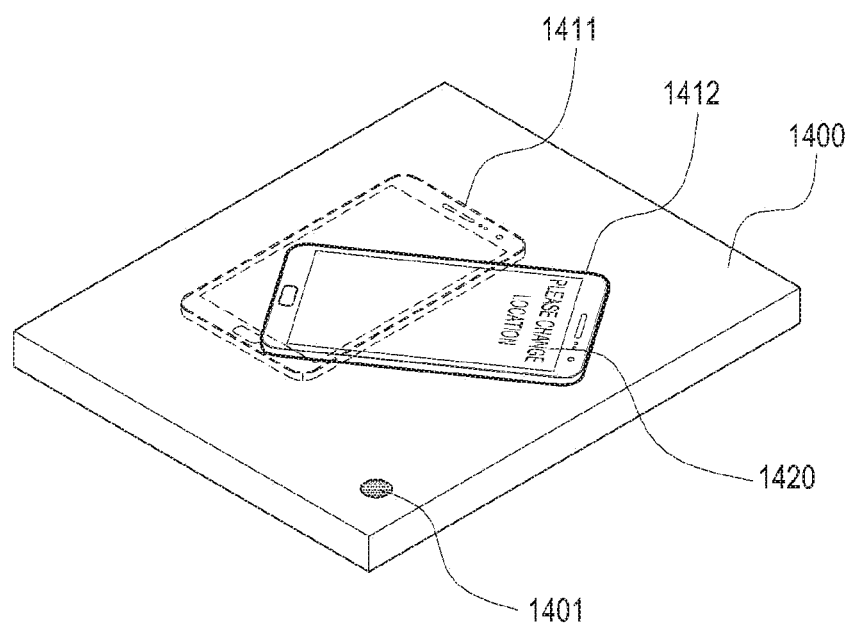

FIGS. 14A and 14B are diagrams for explaining a method for notifying of a state where a location of a wireless power receiver on a wireless power transmitter has deviated from a pre-configured location, according to various embodiments of the present disclosure.

As described above with reference to FIG. 12, a wireless power transmitter 1400 may detect a change of the location of a wireless power receiver. Accordingly, when the location of the wireless power receiver deviates from a location 1411 pre-configured to be optimized in the efficiency of wireless charging, the wireless power transmitter 1400 may provide a notification to a user. For example, when the location of the wireless power receiver deviates from the pre-configured location 1411 and then is moved to a first location 1412, a resonance impedance of the wireless power transmitter 1400 changes, and accordingly, the efficiency of wireless charging of the wireless power transmitter 1400 may be decreased. Therefore, when the location of the wireless power receiver deviates from the pre-configured location 1411, the wireless power transmitter 1400 may provide a user with a notification indicating that the location of the wireless power receiver has deviated from the pre-configured location 1411, to induce a user to move the location of the wireless power receiver to the pre-configured location 1411.

As in FIG. 14a, when the location of the wireless power receiver deviates from the pre-configured location 1411, the wireless power transmitter 1400 may provide a user, through a display unit 1401, such as an LED lamp, etc., included in the wireless power transmitter 1400, with a notification indicating that the location of the wireless power receiver has deviated from the pre-configured location 1411. For example, the wireless power transmitter 1400 may provide a user with a notification by lighting a LED lamp 1401 with a particular color or flickering the LED lamp 1401.

In addition, as in FIG. 14B, when the location of the wireless power receiver deviates from the pre-configured location 1411, the wireless power transmitter 1400 may transmit, to the wireless power receiver, a signal indicating that the wireless power receiver has deviated from the pre-configured location 1411. When the wireless power receiver receives the signal, the wireless power receiver may provide a user, through a display unit, such as display, with a notification indicating that the location of the wireless power receiver has deviated from the pre-configured location 1411.

In addition, the wireless power receiver 1400 may transmit the signal to the wireless power receiver and simultaneously, may provide a user with a notification through the display unit 1401 included in the wireless power transmitter 1400.

Figure 15:
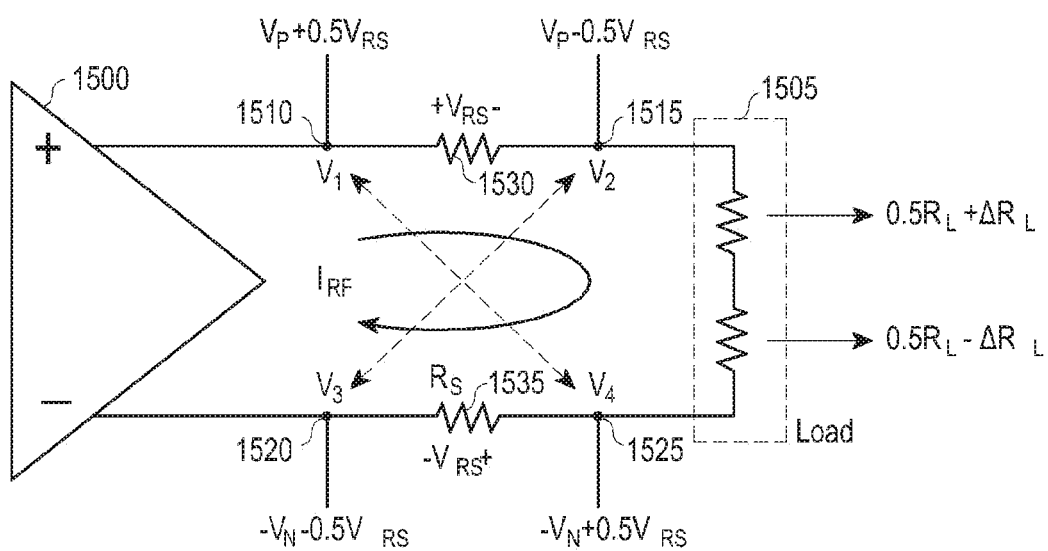
FIG. 15 is a configuration diagram of a current sensing circuit of a differential structure according to various embodiments of the present disclosure.

FIG. 15 is a configuration diagram of a current sensing circuit of a differential structure according to various embodiments of the present disclosure.

Referring to FIG. 15, a current sensing circuit may generally include a power amplifier 1500, a first current detecting resistor 1530, a second current detecting resistor 1535, and a load resistor 1505 that detects a load. In the current sensing circuit of FIG. 15, the current detecting resistor is disposed in series on a signal path for measuring an AC/RF current that is output from the power amplifier 1500 or is transferred to a resonator, and a difference between voltages applied to opposite ends of the current detecting resistor is measured. Specifically, in a differential structure, two current detecting resistors are identically arranged on a positive side and a negative side, and voltages of opposite ends of the current detecting resistors, that is, four regions are sampled in a crossed manner. The cross method is configured to reduce a common mode and offset the effect of asymmetry.

The power amplifier 1500 applies a first output voltage to one end of the load 1505 and applies a second output voltage opposite to the first output voltage to the other end of the load 1505. The second output voltage has a polarity opposite to that of the first output voltage. The power amplifier 1500 according to various embodiments of the present disclosure may be a class D or E amplifier. The load 1505 may be a load corresponding to an antenna or a resonator.

The load resistor 1505 may be indicated by "R" and may be implemented by two resistors including a first resistor and a second resistor as illustrated in FIG. 15, in order to express asymmetry in view of a differential circuit. The first resistor and the second resistor are different from each other by $\Delta R_L$, the first resistor may be expressed as "$0.5RL+\Delta RL$", and the second resistor may be expressed as "$0.5R_L-\Delta R_L$". The middle point between the first resistor and the second resistor is grounded.

Each of the first current detecting resistor 1530 and the second current detecting resistor 1535 may be indicated by "$R_S$". The current sensing circuit is for calculating a voltage of "$V_{RS}$" applied to opposite ends of the first current detecting resistor 1530. When "$V_{RS}$" is calculated, the calculated "$V_{RS}$" may be amplified in a circuit connected to the current sensing circuit and then the amplified calculated "$V_{RS}$" may be used to detect the magnitude of a current. However, in a case of a current detecting circuit having one current detecting resistor arranged therein, a difference between voltages applied to opposite ends of the resistor is very large, so that a problem of a common mode may occur. Therefore, when the voltage swing of a signal to be detected is very large, two current detecting resistors are arranged in a current detecting circuit according to various embodiments of the present disclosure, to prevent the current detecting circuit from being affected by a problem due to a common mode and asymmetry of an inner circuit, etc.

The two current detecting resistors 1530 and 1535 may measure a current signal ($I_{RF}$), which changes depending on a change of the impedance of a load when a voltage signal or a current signal output from the power amplifier 1500 is applied to the load, such as an antenna or a resonator, for example, to the load 1505. Then, the measured current signal ($I_{RF}$) may be used to control an operational amplifier.

Firstly, the first current detecting resistor 1530 may be disposed between a first output of the power amplifier 1500 and the load 1505, and the second current detecting resistor 1535 may be disposed between a second output of the power amplifier 1500 and the load 1505.

A first voltage (V) 1510 is a voltage applied to a front end of the first current detecting resistor 1530. A second voltage (V) 1515 is a voltage applied to a rear end of the first current detecting resistor 1530. A third voltage (V) 1520 is a voltage applied to a front end of the second current detecting resistor 1535. A fourth voltage (V) 1525 is a voltage applied to a rear end of the second current detecting resistor 1535.

Figure 16:
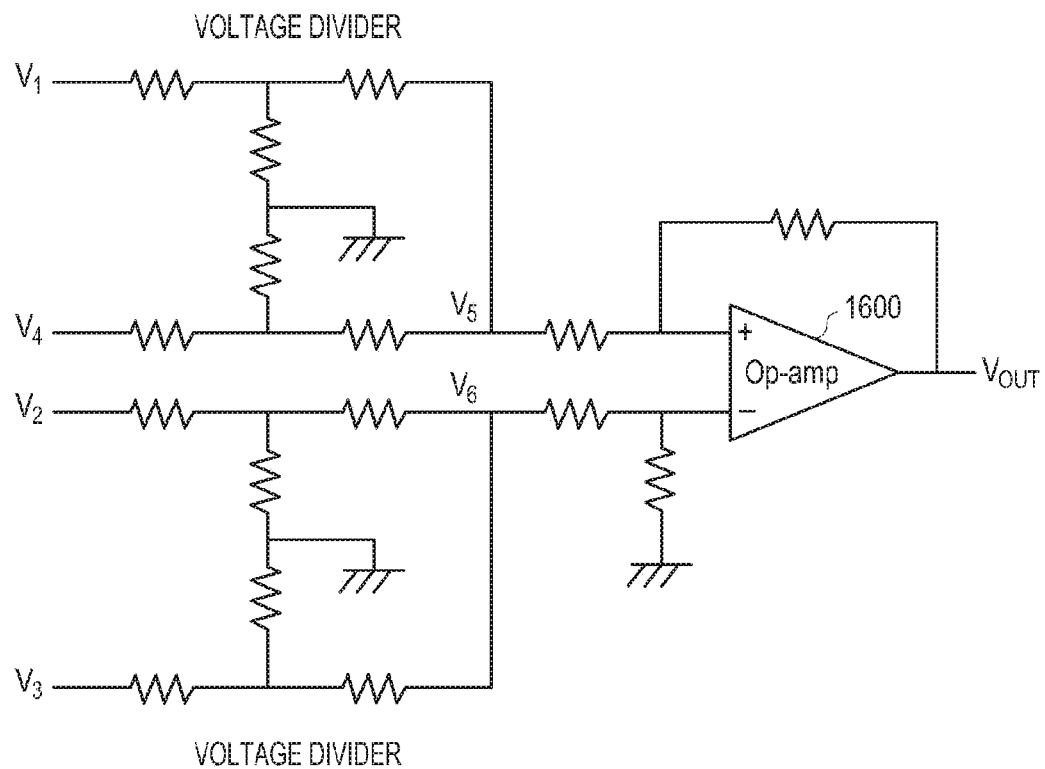
FIG. 16 is a configuration diagram of an amplification unit circuit connected to the current sensing circuit according to various embodiments of the present disclosure.

The current sensing circuit may obtain voltages input to an operational amplifier 1600 of FIG. 16, on the basis of equation 1 and equation 2.

$$V_5=V_1+V_4=(V_P+0.5V_{RS})+(-V_N+0.5V_{RS})=(V_P-V_N)+V_{RS} \quad \text{Equation 1}$$

$$V_6=V_2+V_3=(V_P-0.5V_{RS})+(-V_N-0.5V_{RS})=(V_P-V_N)-V_{RS} \quad \text{Equation 2}$$

In equations 1 and 2, V and V are a positive voltage and a negative voltage of a signal voltage applied to opposite ends of the load 1505, respectively. In various embodiments of the present disclosure, V may be called a first reference voltage, and V is called a second reference voltage. In addition, in equations 1 and 2, $V_{RS}$ is a voltage applied to each of the first current detecting resistor 1530 and the second current detecting resistor 1535. $V_{RS}$ is obtained by multiplying a current ($I_{IF}$) to be detected and a resistance ($R_S$) value, and has a very small voltage value. That is, $V_{RS}$ may be expressed as equation 3.

$$V_{RS}=I_{RF}*R_S \quad \text{Equation 3}$$

Meanwhile, according to equation 1, a fifth voltage (V) may be obtained by adding the first voltage (V1) 1510 and the fourth voltage (V) 1525. In addition, according to equation 2, a sixth voltage (V) may be obtained by adding the second voltage (V) 1515 and the third voltage (V) 1520.

FIG. 16 illustrates a circuit implemented by the equations described above.

FIG. 16 is a configuration diagram of an amplification unit circuit connected to the current sensing circuit according to various embodiments of the present disclosure.

As illustrated in FIG. 16, voltages ($V_1$, $V_2$, $V_3$, and $V_4$) applied to opposite ends of each of the first current detecting resistor 1530 and the second current detecting resistor 1535 of FIG. 15 may be added in a crossed manner through a voltage divider, and then to be output as a fifth voltage ($V_5$) and a sixth voltage ($V_6$). A first voltage divider may add a first voltage ($V_1$) applied to the front end of the first current detecting resistor 1530, and a fourth voltage ($V_4$) applied to the rear end of the second current detecting resistor 1535. In addition, a second voltage divider may add a second voltage (V$_2$) applied to the rear end of the first current detecting resistor 1530, and a third voltage (V$_3$) applied to the front end of the second current detecting resistor 1535. The first voltage divider and the second voltage divider may be connected to a front end of the operational amplifier 1600.

Accordingly, a fifth voltage (V$_5$) and a sixth voltage (V$_6$) are input to the operational amplifier 1600, and a difference between the fifth voltage (V$_5$) and the sixth voltage (V$_6$) may be obtained through the operational amplifier 1600. An output voltage (V$_O$) obtained through a subtraction circuit using the operational amplifier 1600 may be expressed as equation 4. The operational amplifier 1600 may amplify the difference between the fifth voltage (V$_5$) and the sixth voltage (V$_6$), by gain A.

$$V_O = A*(V_5-V_6) = A(((V_P-V_N)+V_{RS})-((V_P-V_N)-V_{RS})) = 2.4*V_{RS} \quad \text{Equation 4}$$

In equation 4, A indicates a pre-configured gain, i.e. a gain of the operational amplifier 1600.

According to equation 4, an output voltage (V) output from the operational amplifier 1600 is not affected by V or V, that is, may be output as a voltage which is not affected by the load 1505 of "R".

As described above, an output voltage (V) of 2 A*V that is not affected by a change of the load 1505 of "R" according to various embodiments of the present disclosure may be obtained.

Furthermore, even when the magnitudes of V and V are different from each other in comparison with asymmetry of a differential structure, the equations may be applied thereto. Therefore, a sensing performance due to asymmetry can be improved. In addition, in a common mode problem, in view of an input of the operational amplifier 1600, V or V are expressed by V−V. Therefore, when asymmetry is not severe, that is, when a difference in magnitude between V and V belongs to a predetermined range, V and V of voltage swing of the load which have a considerably reduced magnitude than an absolute magnitude thereof are applied to a common mode. Accordingly, a problem that a desired signal is not seen due to the output magnitude of a common mode signal can be solved.

Meanwhile, an output voltage (V) output from the operational amplifier 1600 is required to be converted from a signal having an alternating type to a constant voltage having a direct type, so as to be input to the control unit 312 and the communication unit 313. To end this, as illustrated in FIG. 17, a rectifier circuit unit 1700 that performs direct levelling may be implemented.

Accordingly, the control unit and the communication unit of the wireless power transmitter may generate a control signal on the basis of an output voltage Q provided from a sensing circuit. Accordingly, the signal generation unit may generate power on the basis of the control signal provided from the control unit.

Figure 17:
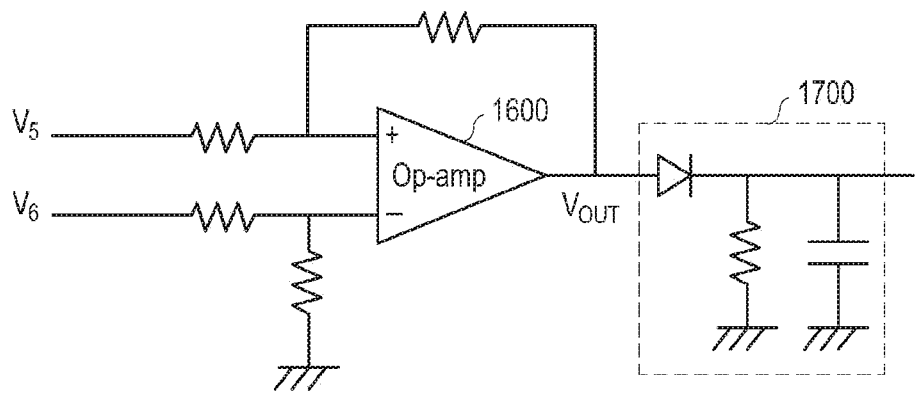
FIG. 17 is a configuration diagram of a rectifier circuit unit according to various embodiments of the present disclosure.

As described above, the sensing circuit according to various embodiments of the present disclosure may include the circuits of FIG. 15 and FIG. 16 may further include the rectifier circuit unit 1700 of FIG. 17 in order to provide the output voltage ( ) to the control unit and the communication unit.

If the sensing circuit is implemented by including the configurations of FIG. 15 and FIG. 16, the sensing circuit may include: a first amplifier that supplies a first output voltage to one end of a load and supplies a second output voltage opposite to the first output voltage to the other end of the load; a first current detecting resistor disposed between a first output of the first amplifier and the load; a second current detecting resistor disposed between a second output of the first amplifier and the load; and a second amplifier that calculates a fifth voltage by adding a first voltage applied to a front end of the first current detecting resistor and a fourth voltage applied to a rear end of the second current detecting resistor, and a sixth voltage by adding a second voltage applied to a rear end of the first current detecting resistor and a third voltage applied to a front end of the second current detecting resistor, and then outputs an output voltage proportional to a difference between the fifth voltage and the sixth voltage.

Figure 18:
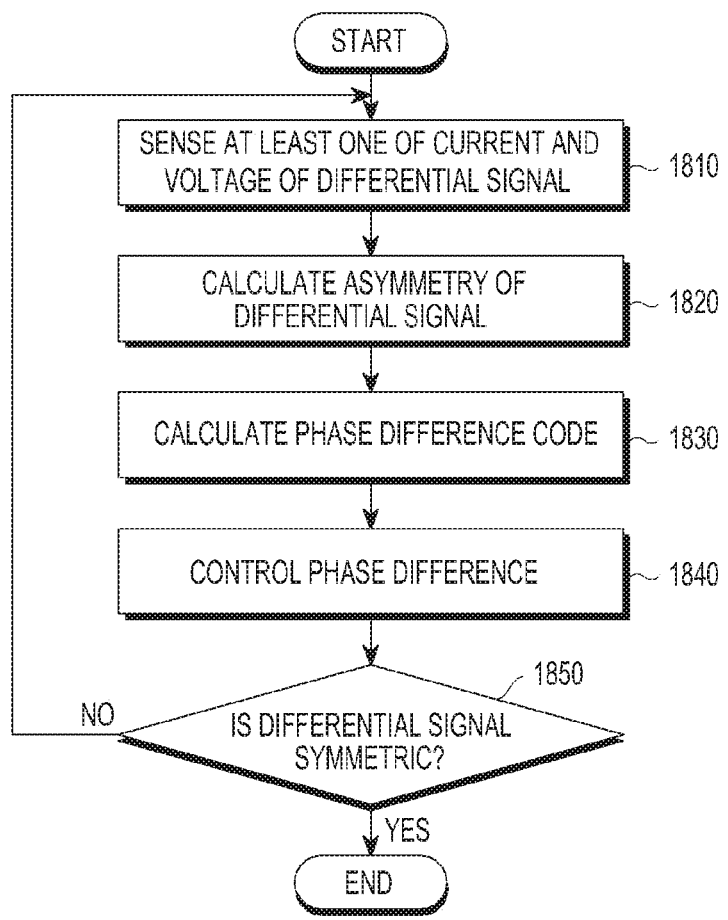
FIG. 18 illustrates a flow chart of a method for controlling the wireless power transmitter according to various embodiments of the present disclosure.

FIG. 18 illustrates a flow chart of a method for controlling the wireless power transmitter according to various embodiments of the present disclosure.

In operation 1810, the wireless power transmitter may sense at least one among a current voltage and a voltage value of at least one signal in a differential signal. Meanwhile, in various embodiments of the present disclosure, the wireless power transmitter may sense at least one among a current voltage and a voltage value of a single-ended signal.

In operation 1820, the wireless power transmitter may calculate the asymmetry of the differential signal. More specifically, the wireless power transmitter may determine whether a difference in phase between two signals included in the differential signal corresponds to a pre-configured value, and then may calculate the asymmetry of the differential signal on the basis of a result obtained by the determination. Meanwhile, in various embodiments of the present disclosure, the wireless power transmitter may determine whether the phase of the single-ended signal corresponds to a pre-configured value.

In operation 1830, the wireless power transmitter may calculate a phase difference code. As described above with reference to FIG. 9A, the phase difference code and the magnitude of an output voltage may be approximated to a linearized equation in which they are comparatively linearly proportional. Accordingly, the wireless power transmitter may change the phase difference code to minimize a code control time and find an optimal code, so as to obtain symmetry of a voltage. In operation 1840, the wireless power transmitter may perform a phase difference control on the basis of the calculated phase difference code. In operation 1850, the wireless power transmitter may determine whether the differential signal recovers symmetry thereof, and when the differential signal fails to recover symmetry thereof, may repeat a procedure of differential signal sensing to phase difference control.

Meanwhile, in various embodiments of the present disclosure, the wireless power transmitter may determine a phase difference code for adjusting the phase of the single-ended signal, to control the phase. The wireless power transmitter may repeat a procedure of sensing and phase control in a feedback process, thereby controlling the phase of the single-ended signal to correspond to the pre-configured value.

Figure 19:
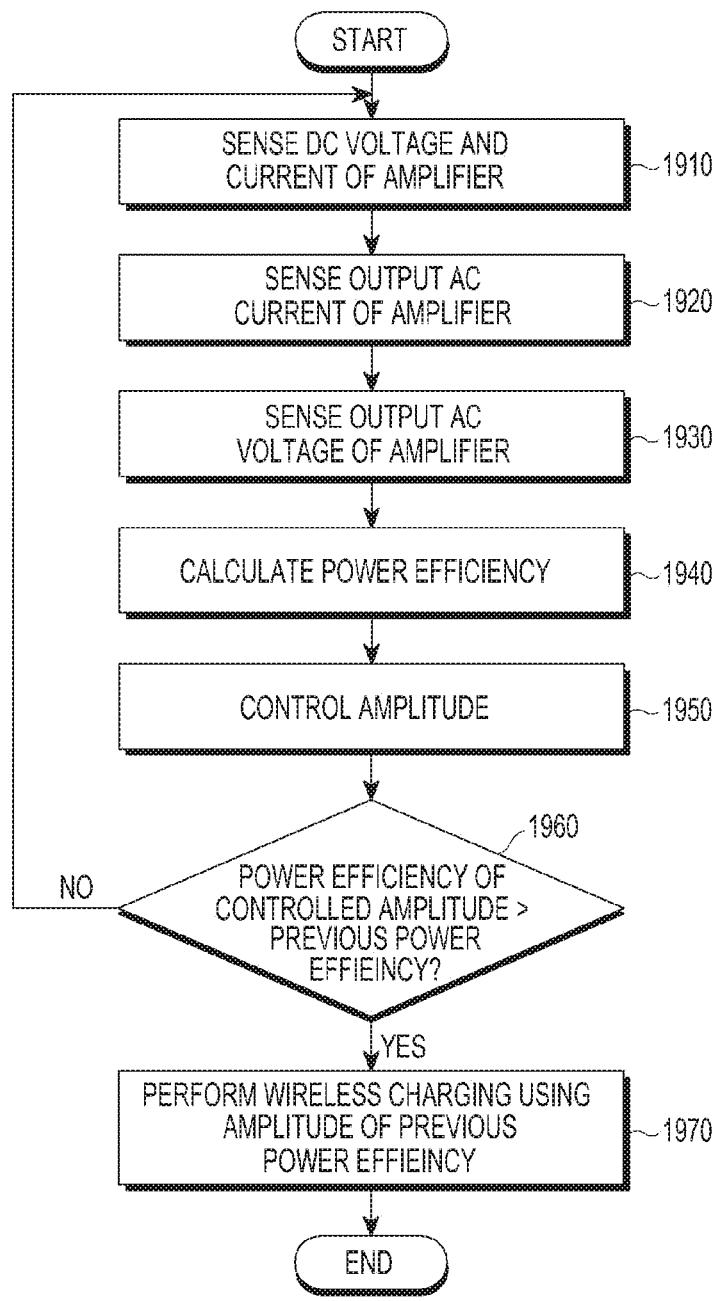
FIG. 19 illustrates a flow chart of a method of controlling the wireless power transmitter according to various embodiments of the present disclosure.

FIG. 19 illustrates a flow chart of a method of controlling the wireless power transmitter according to various embodiments of the present disclosure.

In operation 1910, the wireless power transmitter may sense DC voltage and current of the amplifier. In operation 1920, the wireless power transmitter may sense output AC current of the amplifier. In operation 1930, the wireless power transmitter may sense output AC voltage of the amplifier. In operation 1940, the wireless power transmitter may calculate a power efficiency on the basis of the DC voltage and current, and the AC current and voltage.

In operation 1950, the wireless power transmitter may control the amplitude of at least one signal in a differential signal or a single-ended signal on the basis of the calculated power efficiency. In various embodiments of the present disclosure, the wireless power transmitter may change a control code of a circuit of controlling the amplitude of a driving voltage, thereby adjusting the amplitude. As described with reference to FIG. 9B, as the amplitude increases, the power efficiency increases. Then, when the increasing amplitude becomes larger than an optimal amplitude, the power efficiency may be decreased again. Accordingly, the wireless power transmitter may adjust the amplitude of a signal to be an optimal amplitude. For example, in operation 1960, the wireless power transmitter may determine whether the power efficiency in the controlled amplitude is larger than that before the control. When the power efficiency in the controlled amplitude is larger than that before the control, the wireless power transmitter may repeat amplitude control. When the power efficiency in the controlled amplitude is equal to or smaller than that before the control, the wireless power transmitter may perform wireless charging using the amplitude in the power efficiency before the control, in operation 1970.

Each of the elements described in the present disclosure may be configured with one or more components, and the names of the corresponding elements may vary based on the type of electronic device. The electronic device according to various embodiments of the present disclosure may further include at least one of the elements described in the present disclosure. Some elements may be omitted or other additional elements may be further included in the electronic device. Also, some of the elements of the electronic device according to various embodiments may be combined into one entity, which may perform functions identical to those of the relevant elements before the combination.

The term "module" as used herein may, for example, mean a unit including one of hardware, software, and firmware or a combination of two or more of them. The "module" may be interchangeably used with, for example, the term "unit", "logic", "logical block", "component", or "circuit". The "module" may be a minimum unit of an integrated component or a part thereof. The "module" may be a minimum unit for performing one or more functions or a part thereof. The "module" may be mechanically or electronically implemented. For example, the "module" according to the present disclosure may include at least one of an Application-Specific Integrated Circuit (ASIC) chip, a Field-Programmable Gate Arrays (FPGA), and a programmable-logic device for performing operations which are already known or are to be developed in the future.

At least some of the devices (for example, modules or functions thereof) or the method (for example, operations) according to various embodiments may be implemented by, for example, an instruction stored in a computer-readable storage medium in a programming module form. The instruction, when executed by a processor, may cause the one or more processors to execute the function corresponding to the instruction. The computer-readable storage medium may be, for example, the memory.

The computer readable recording medium may include a hard disk, a floppy disk, magnetic media (e.g., a magnetic tape), optical media (e.g., a Compact Disc Read Only Memory (CD-ROM) and a Digital Versatile Disc (DVD)), magneto-optical media (e.g., a floptical disk), a hardware device (e.g., a Read Only Memory (ROM), a Random Access Memory (RAM), a flash memory), and the like. In addition, the program commands may include high class language codes, which can be executed in a computer by using an interpreter, as well as machine codes made by a compiler. The aforementioned hardware device may be configured to operate as one or more software modules in order to perform the operation of the present disclosure, and vice versa.

The module or the programming module according to various embodiments may include one or more of the aforementioned elements or may further include other additional elements, or some of the aforementioned elements may be omitted. Operations executed by a module, a programming module, or other elements according to various embodiments of the present disclosure may be executed sequentially, in parallel, repeatedly, or in a heuristic manner. Furthermore, some operations may be executed in a different order or may be omitted, or other operations may be added.

According to various embodiments, a storage medium may store commands that, when executed by at least one processor, cause the at least one processor to perform at least one operation.

Various embodiments disclosed herein are provided merely to easily describe technical details of the present disclosure and to help the understanding of the present disclosure, and are not intended to limit the scope of the present disclosure. Accordingly, the scope of the present disclosure should be construed as including all modifications or various other embodiments based on the technical idea of the present disclosure.

What is claimed is:

1. A wireless power transmitter comprising:
a signal generation circuit configured to generate a differential signal;
an amplifier configured to amplify the differential signal by a pre-configured gain;
a resonance circuit configured to generate an electromagnetic wave using the amplified differential signal and radiate the generated electromagnetic wave; and
a signal adjustment circuit,
wherein the signal adjustment circuit is configured to:
sense at least one among a current and a voltage of the amplified differential signal in an input terminal of the resonance circuit, and
adjust a phase of at least one of two signals included in the differential signal output from the signal generation circuit on the basis of a difference in phase between the two signals.

2. The wireless power transmitter of claim 1, wherein the signal adjustment circuit is further configured to:
generate a control signal including adjustment information on at least one of the phase or an amplitude of the differential signal; and
adjust at least one of the phase or the amplitude of the differential signal on the basis of the control signal.

3. The wireless power transmitter of claim 2, wherein the signal adjustment circuit is further configured to:
adjust the phase of at least one of the differential signal such that the difference in phase between the two signals included in the differential signal corresponds to a pre-configured value.

4. The wireless power transmitter of claim 3, wherein the signal adjustment circuit comprises:
a plurality of delay devices configured to delay at least one signal in the differential signal.

5. The wireless power transmitter of claim 4, wherein the control signal comprises information on a number of at least one delay device to be controlled to be in an ON state among the plurality of delay devices.

6. The wireless power transmitter of claim 5, wherein the signal adjustment circuit further comprises:
  a multiplexer configured to output an ON state control signal to the at least one delay device to be controlled to be in an ON state and output an OFF state control signal to remaining delay devices among the plurality of delay devices.

7. The wireless power transmitter of claim 4, wherein the signal adjustment circuit further comprises:
  at least one first capacitor connected between the plurality of delay devices.

8. The wireless power transmitter of claim 7,
  wherein each of the at least one first capacitor is a variable capacitor, and
  wherein the control signal comprises information on a capacitance of the variable capacitor.

9. The wireless power transmitter of claim 2, wherein the signal adjustment circuit is further configured to adjust an amplitude of the differential signal.

10. The wireless power transmitter of claim 1, wherein the signal adjustment circuit comprises:
  a Power Amplifier (PA) driver configured to remove a noise from the differential signal and transfer the differential signal from which the noise has been removed, to the amplifier.

11. The wireless power transmitter of claim 10, wherein the PA driver comprises:
  at least one first MOSFET configured to process the differential signal; and
  at least one inductor connected to the at least one first MOSFET.

12. The wireless power transmitter of claim 11, wherein the PA driver further comprises:
  at least one second MOSFET connected to at least one among the at least one first MOSFET and the inductor.

13. The wireless power transmitter of claim 12, wherein the PA driver further comprises:
  at least one second capacitor connected to the at least one first MOSFET and the at least one second MOSFET.

14. The wireless power transmitter of claim 2, wherein the signal adjustment circuit further comprises:
  an ADC circuit configured to perform ADC on a result obtained by the sensing and then output a result obtained by the performed ADC.

* * * * *